US011908772B2

(12) United States Patent
Yamada et al.

(10) Patent No.: US 11,908,772 B2
(45) Date of Patent: Feb. 20, 2024

(54) SEMICONDUCTOR MODULE AND VEHICLE

(71) Applicant: FUJI ELECTRIC CO., LTD., Kanagawa (JP)

(72) Inventors: Takafumi Yamada, Matsumoto (JP); Hiromichi Gohara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 366 days.

(21) Appl. No.: 17/183,386

(22) Filed: Feb. 24, 2021

(65) Prior Publication Data

US 2021/0335693 A1 Oct. 28, 2021

(30) Foreign Application Priority Data

Apr. 27, 2020 (JP) .................................. 2020-078725

(51) Int. Cl.
| | | |
|---|---|---|
| *H01L 23/473* | (2006.01) | |
| *H01L 23/367* | (2006.01) | |
| *H01L 23/31* | (2006.01) | |
| *H01L 23/373* | (2006.01) | |
| *H05K 7/20* | (2006.01) | |
| *H01L 23/00* | (2006.01) | |

(52) U.S. Cl.
CPC ........ *H01L 23/473* (2013.01); *H01L 23/3142* (2013.01); *H01L 23/367* (2013.01); (Continued)

(58) Field of Classification Search
CPC .. H05K 1/0204; H05K 1/0209; H05K 1/0207; H05K 1/181; H05K 7/06; H05K 7/1432; H05K 7/20218; H05K 7/20254–20263; H05K 7/20272; H05K 7/2039; H05K 7/20845; H05K 7/209; H05K 7/20927–20936; H05K 7/20445; (Continued)

(56) References Cited

U.S. PATENT DOCUMENTS

| | | | |
|---|---|---|---|
| 8,472,188 B2 * | 6/2013 | Horiuchi ............ H05K 7/20927 165/80.4 |
| 2010/0172104 A1 | 7/2010 | Yoshida | |

(Continued)

FOREIGN PATENT DOCUMENTS

| | | | |
|---|---|---|---|
| JP | 2010161203 A | 7/2010 |
| JP | 2016225339 A | 12/2016 |

(Continued)

OTHER PUBLICATIONS

JP-2020035927-A English Translation (Year: 2020).*

*Primary Examiner* — Amir A Jalali

(57) ABSTRACT

Provided is a semiconductor module including a semiconductor device and a cooling apparatus, wherein the semiconductor device includes semiconductor chips, circuit boards where the semiconductor chips are implemented, and a resin structure for sealing the semiconductor chips; the cooling apparatus includes a top plate, a side wall, a bottom plate, a coolant flow portion, a plurality of fins and reinforcement pins; the metal layer has a part overlapped with the cooling region, and other parts other than the part overlapped with one communication region of the first communication region and the second communication region in planar view; and the reinforcement pins are arranged in the one communication region.

18 Claims, 12 Drawing Sheets

(52) U.S. Cl.
CPC .......... *H01L 23/3735* (2013.01); *H01L 24/32* (2013.01); *H05K 7/205* (2013.01); *H05K 7/20263* (2013.01); *H05K 7/20927* (2013.01); *H01L 2224/32225* (2013.01)

(58) Field of Classification Search
CPC .. H05K 7/1448; H05K 7/205; H05K 7/20509; H05K 7/20945; H01L 23/3142; H01L 23/367; H01L 23/3672; H01L 23/3735; H01L 23/4006; H01L 23/427; H01L 23/473
See application file for complete search history.

(56) References Cited

U.S. PATENT DOCUMENTS

| | | | | |
|---|---|---|---|---|
| 2015/0382506 | A1* | 12/2015 | Yamada | H01L 23/473 361/699 |
| 2017/0271240 | A1* | 9/2017 | Inoue | H01L 23/473 |
| 2017/0278770 | A1* | 9/2017 | Kato | H01L 23/4006 |
| 2019/0279917 | A1* | 9/2019 | Gohara | F28F 3/025 |
| 2019/0341335 | A1* | 11/2019 | Koyama | H05K 7/20927 |
| 2019/0363036 | A1* | 11/2019 | Arai | H05K 7/20254 |
| 2020/0051892 | A1* | 2/2020 | Gohara | H01L 23/043 |
| 2020/0170147 | A1* | 5/2020 | Arai | H01L 23/473 |
| 2020/0266126 | A1* | 8/2020 | Arai | H05K 7/209 |
| 2020/0286813 | A1* | 9/2020 | Yamada | H01L 25/18 |
| 2020/0365419 | A1* | 11/2020 | Onishi | H01L 23/46 |

FOREIGN PATENT DOCUMENTS

| | | |
|---|---|---|
| JP | 2017050375 A | 3/2017 |
| JP | 2017092468 A | 5/2017 |
| JP | 2020035927 A * | 3/2020 |
| WO | 2015033724 A1 | 3/2015 |

* cited by examiner

SEMICONDUCTOR MODULE AND VEHICLE

The contents of the following Japanese patent application are incorporated herein by reference:
NO. 2020-078725 filed in JP on Apr. 27, 2020

BACKGROUND

1. Technical Field

The present invention relates to a semiconductor module and a vehicle.

2. Related Art

Conventionally, a semiconductor module, in which a cooler including cooling fins is implemented, including a plurality of semiconductor elements such as power semiconductor chips has been known (refer to, for example, Patent Document 1-4).

PRIOR ART DOCUMENT

[Patent Document]
Patent Document 1: Japanese Unexamined Patent Application, Publication No. 2017-092468
Patent Document 2: Japanese Unexamined Patent Application, Publication No. 2017-050375
Patent Document 3: Patent No. WO2015/033724
Patent Document 4: Japanese Unexamined Patent Application, Publication No. 2016-225339
Patent Document 5: Japanese Unexamined Patent Application, Publication No. 2010-161203

DESCRIPTION OF EXEMPLARY EMBODIMENTS

Hereinafter, the present invention will be described through embodiments of the invention, but the following embodiments do not limit the invention according to the claims. Further, not all of the combinations of features described in the embodiments are essential to the solving means of the invention.

Figure 1:
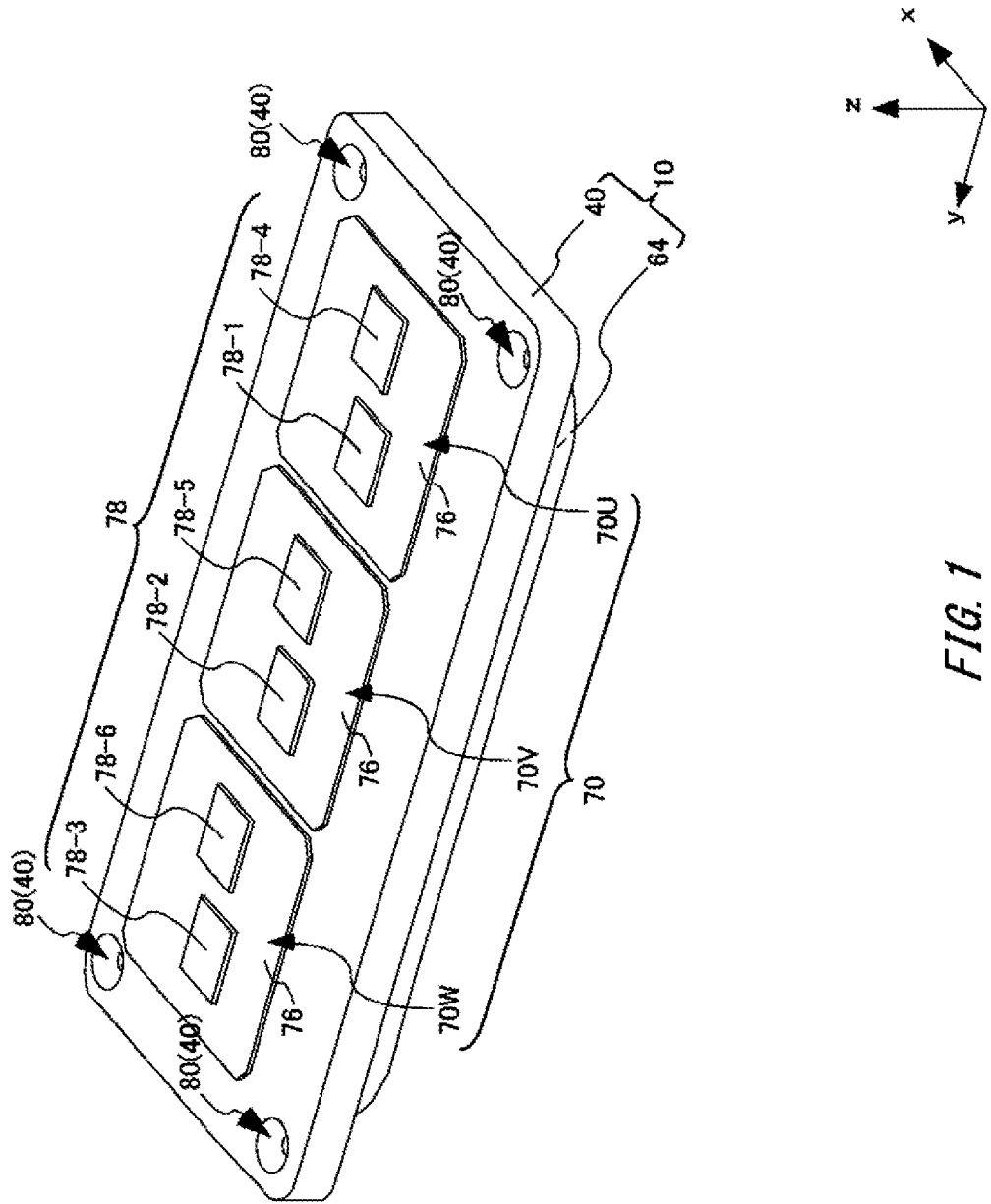
FIG. 1 illustrates a schematic perspective view of one example of a semiconductor module 100 according to one embodiment of the present invention.
Figure 2:
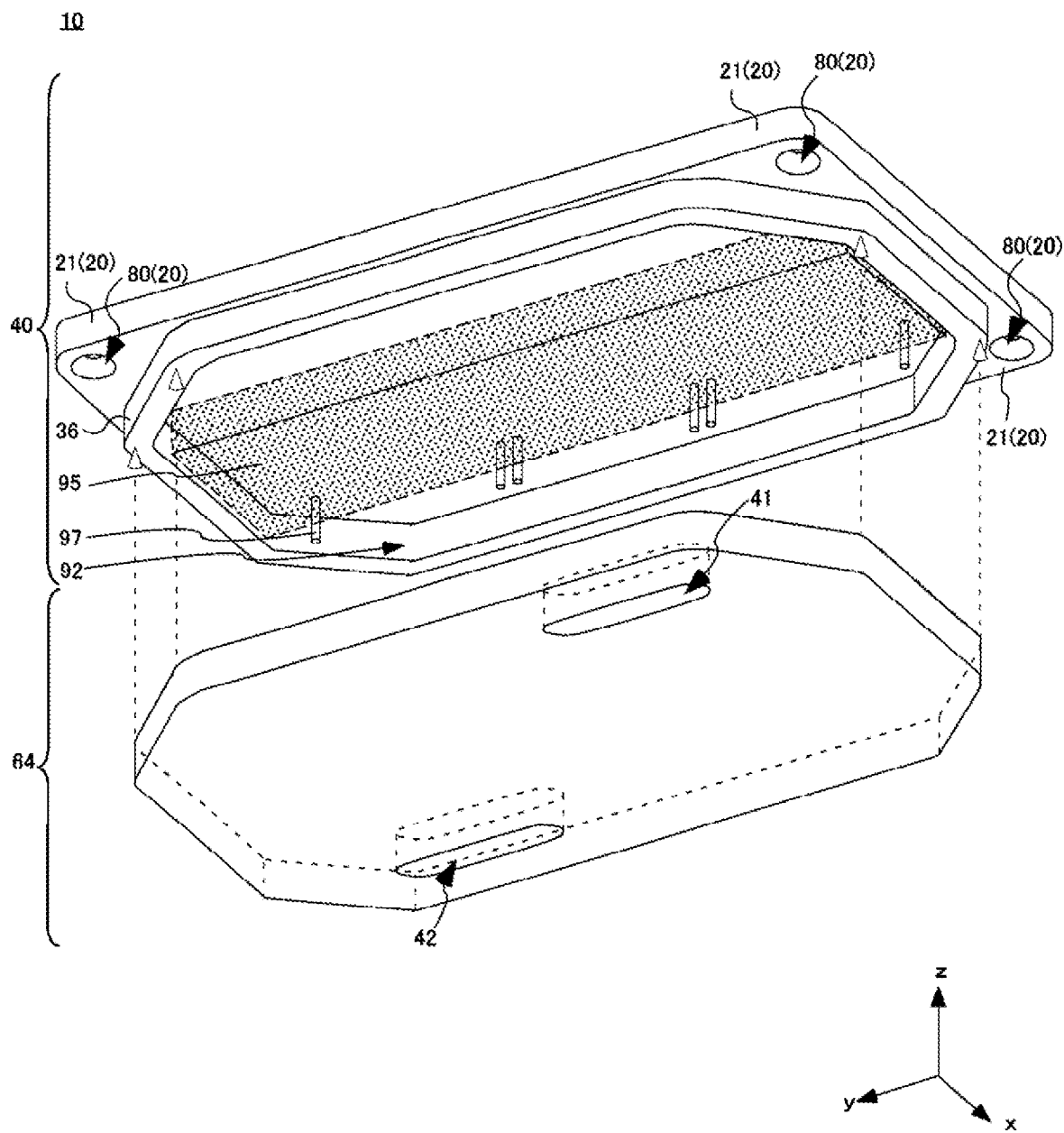
FIG. 2 illustrates a schematic perspective view of one example of a cooling apparatus 10 of the semiconductor module 100 according to one embodiment of the present invention.
Figure 3:
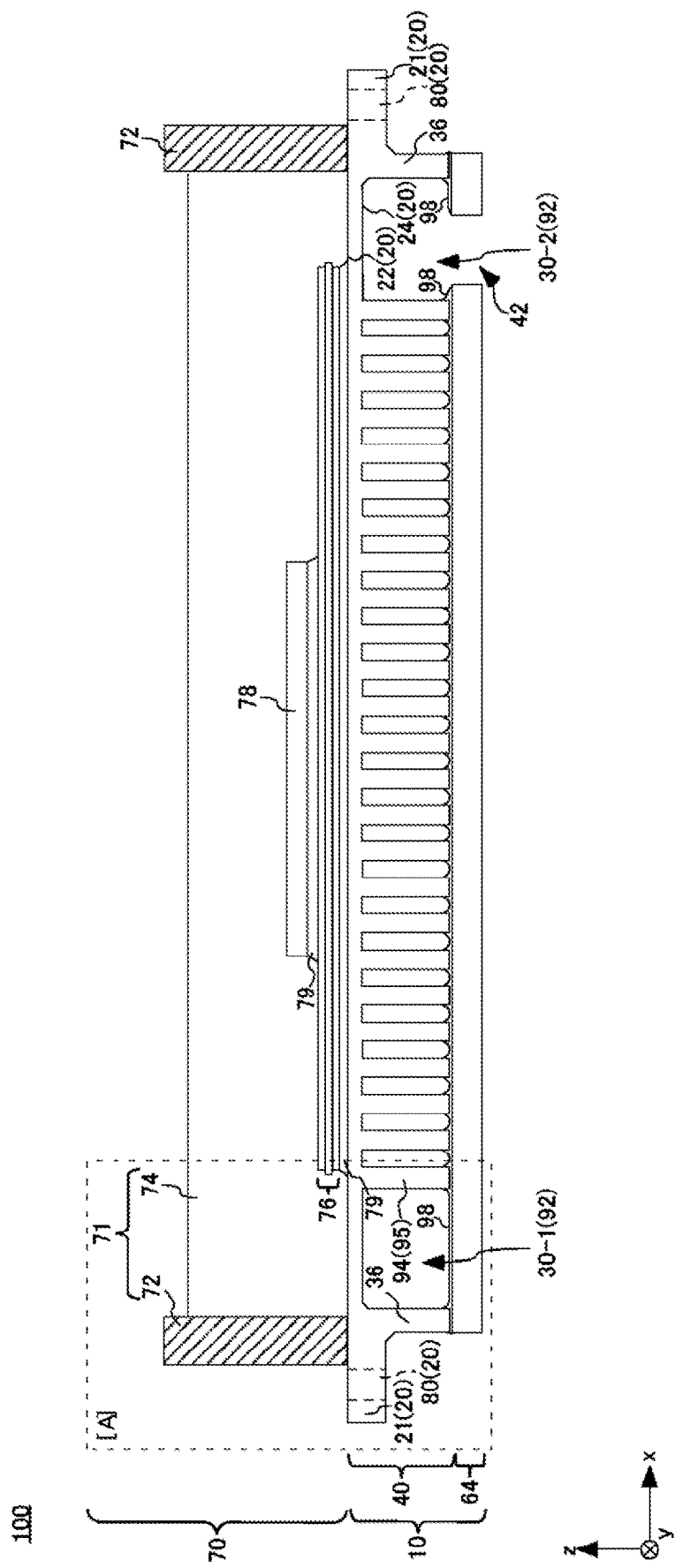
FIG. 3 illustrates a schematic cross sectional view of one example of the semiconductor module 100 according to one embodiment of the present invention.
Figure 4:
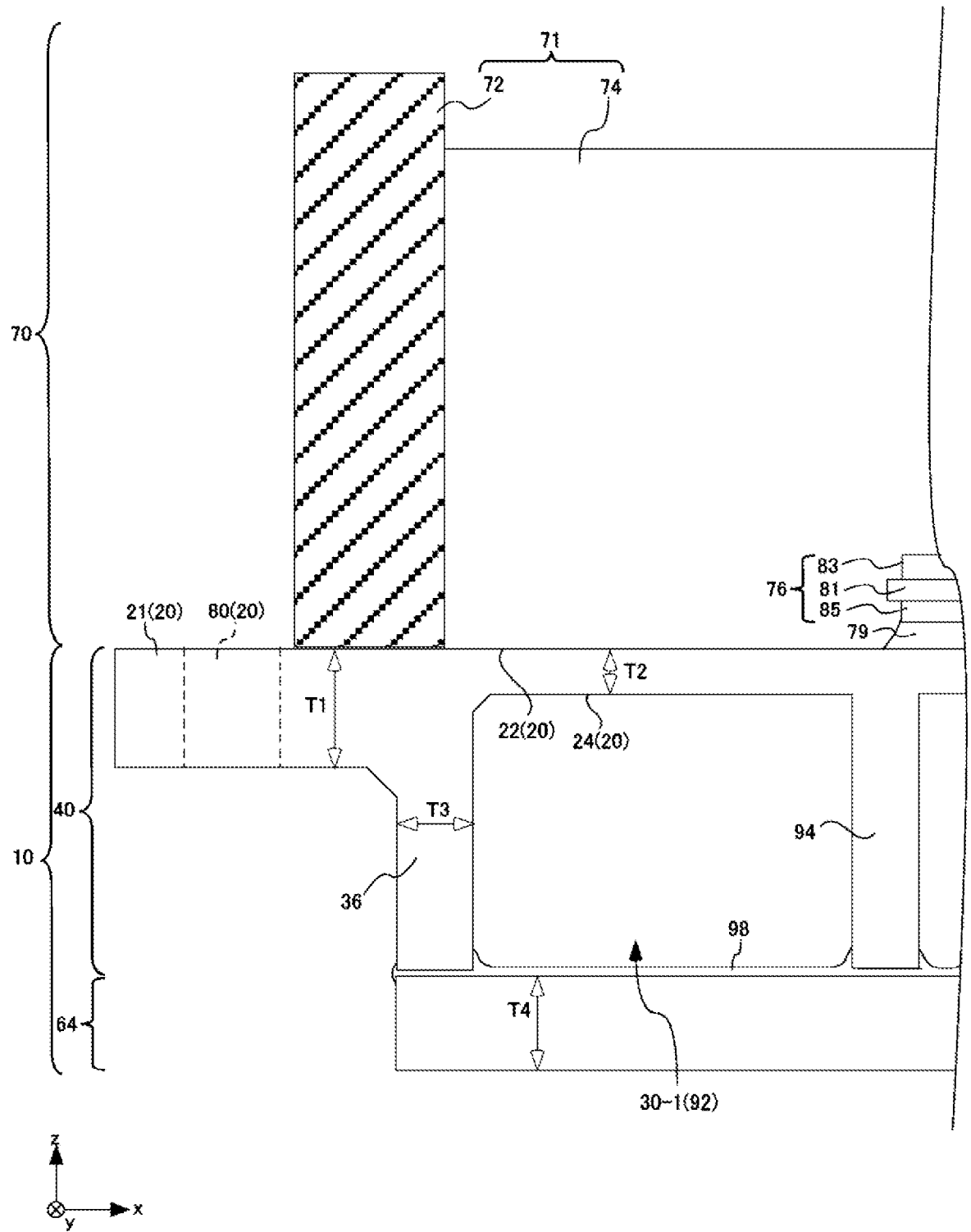
FIG. 4 illustrates a partially enlarged view of region [A] indicated by dashed lines in FIG. 3.
Figure 5:
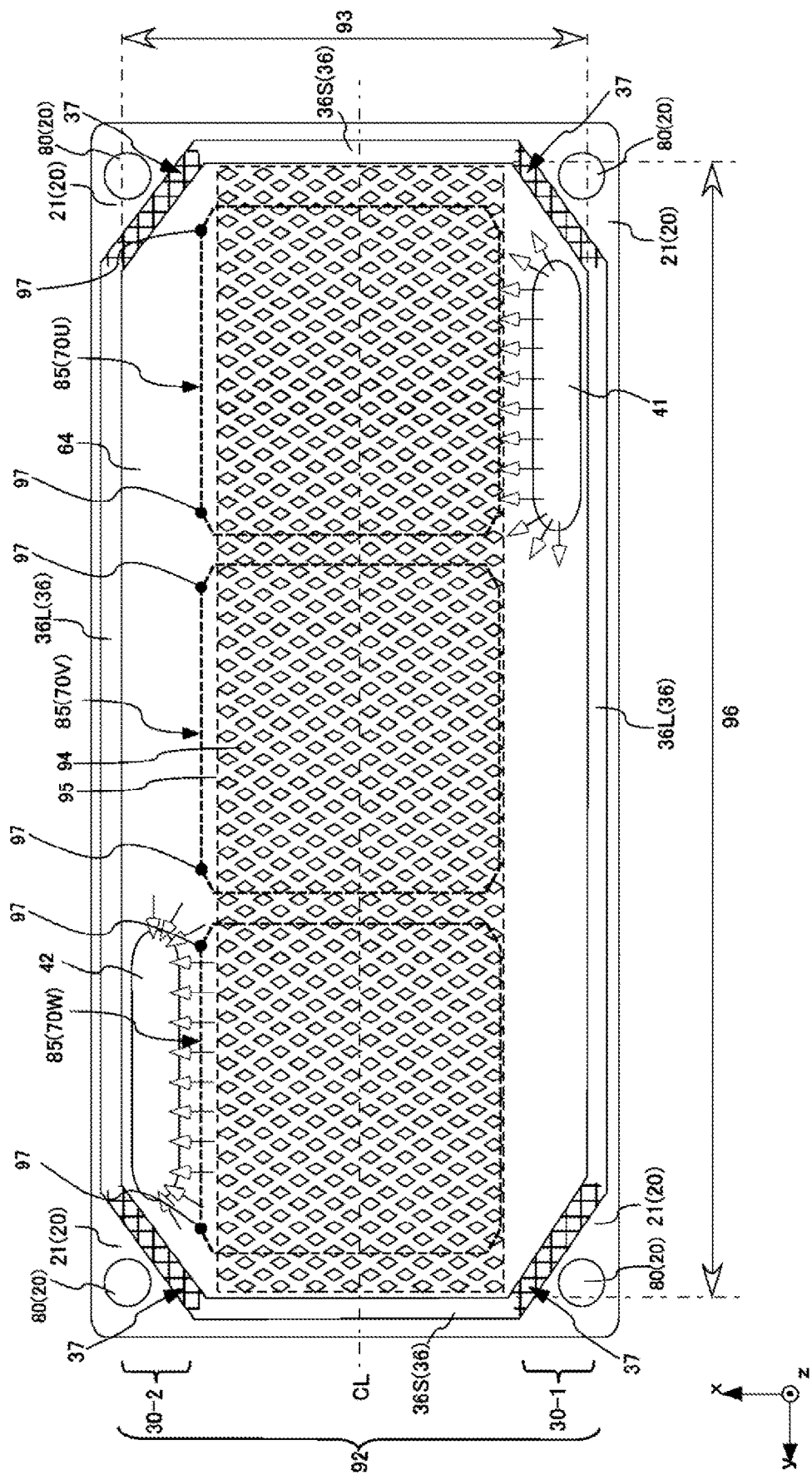
FIG. 5 illustrates a diagram showing one example of the arrangement of a cooling region 95 of the cooling apparatus 10, the arrangement of metal layers 85 of semiconductor devices 70, the arrangement and shape of fins 94, the arrangement and shape of reinforcement pins 97, and the flow direction of the coolant in the semiconductor module 100 according to one embodiment of the present invention.

FIG. 1 illustrates a schematic perspective view of one example of a semiconductor module 100 according to one embodiment of the present invention, and FIG. 2 illustrates a schematic perspective view of one example of a cooling apparatus 10 of the semiconductor module 100. And, FIG. 3 illustrates a schematic cross sectional view of one example of the semiconductor module 100 according to one embodiment of the present invention, and FIG. 4 illustrates a partially enlarged view of a region A in FIG. 3. And, FIG. 5 illustrates a diagram showing one example of the arrangement of a cooling region 95 of the cooling apparatus 10, the arrangement of metal layers 85 of semiconductor devices 70, the arrangement and shape of fins 94, the arrangement and shape of reinforcement pins 97, and the flow direction of coolant in the semiconductor module 100 according to one embodiment of the present invention.

In FIG. 1 and FIG. 2, the resin structure 71 shown in FIG. 3 and FIG. 4 is omitted from the illustration simply to clarify the description. In FIG. 3, a virtually cut state in the xz plane of both of the semiconductor chip 78 of the W phase unit 70W in the semiconductor module 100 shown in FIG. 1, and the outlet 42 of the cooling apparatus 10 shown in FIG. 2, is illustrated. And, in FIG. 4, the thickness in the z axis direction of the fastening portion 21 of the top plate 20 is indicated as T1, the thickness in the z axis direction of the cooling region 95 of the top plate 20 is indicated as T2, the thickness in the x axis direction of the side wall 36 is indicated as T3, and the thickness in the z axis direction of the bottom plate 64 is indicated as T4. And, in FIG. 5, the metal layers 85 of each of the U phase unit 70U, the V phase unit 70V and the W phase unit 70W illustrated in FIG. 1 are indicated by dashed lines.

The semiconductor module 100 includes semiconductor devices 70 and a cooling apparatus 10. The semiconductor device 70 according to this embodiment is placed on a cooling apparatus 10. In the description of this embodiment, the surface of the cooling apparatus 10 on which the semiconductor devices 70 are placed is referred to as the xy plane, and the axis orthogonal to the xy plane is referred to as the z axis. The xyz axes form a right-handed system. In the description of this embodiment, the direction from the cooling apparatus 10 toward the semiconductor device 70 in the z axis direction is referred to as up, and the opposite direction is referred to as down, but the up and down directions are not limited to the gravity direction. And in the description of this embodiment, among the surfaces of each member, the surface on the upper side is referred to as the upper surface, the surface on the lower side is referred to as the lower surface, and the surface between the upper and lower surfaces is referred to as the side surface. In the description of this embodiment, the planar view means the case of seeing the semiconductor module 100 from the positive direction of the z axis direction.

The semiconductor device 70 has semiconductor chips 78, circuit boards 76 on which the semiconductor chips 78 are implemented, and a resin structure 71 for sealing the semiconductor chips 78. The semiconductor device 70 may also include two or more circuit boards 76. The semiconductor device 70 according to this embodiment includes three circuit boards 76, and the three circuit boards 76 are arranged in the y axis direction on the cooling apparatus 10. One or more semiconductor chips 78 may be loaded on each circuit board 76. In this embodiment, there are two semiconductor chips 78 loaded on each circuit board 76, and the two semiconductor chips 78 are arranged in the y axis direction on the circuit board 76.

The semiconductor module 100 of this embodiment functions as an apparatus for configuring a three-phase AC inverter. As shown in FIG. 1, the semiconductor devices 70 of this embodiment includes, as power semiconductor devices, a U phase unit 70U including circuit boards 76 and a semiconductor chip 78-1 and a semiconductor chip 78-4, a V phase unit 70V including circuit boards 76, a semiconductor chip 78-2 and a semiconductor chip 78-5, and a W phase unit 70W including circuit boards 76 and a semiconductor chip 78-3 and a semiconductor chip 78-6. In addition, each semiconductor chip 78 of the U phase unit 70U, the V phase unit 70V and the W phase unit 70W is a heat source for generating heat when the semiconductor module 100 operates.

The semiconductor chip 78 is a vertical semiconductor element, and has an upper-surface electrode and a lower-surface electrode. The semiconductor chip 78, as one example, includes elements such as insulated gate bipolar transistors (IGBTs) formed on semiconductor substrates of silicon or the like, MOS field effect transistors (MOSFETs) and freewheeling diodes (FWDs). The semiconductor chip 78 may also be a reverse conducting IGBT (RC-IGBT) in which IGBT and FWD are formed on one semiconductor substrate. In the RC-IGBT, the IGBT and the FWD may be connected in reversely parallel to each other.

The lower-surface electrode of the semiconductor chip 78 is connected to the upper surface of the circuit board 76. The semiconductor chip 78 of this embodiment is fixed on the upper surface of the circuit board 76 by a solder 79. The upper-surface electrode of the semiconductor chip 78 may be an emitter, source or anode electrode, and the lower-surface electrode may be a collector, drain or cathode electrode. The semiconductor substrate of the semiconductor chip 78 may also be silicon carbide (SiC) or gallium nitride (GaN).

The semiconductor chip 78 including switching devices such as IGBTs or MOSFETs has a control electrode. The semiconductor module 100 may also have a control terminal connected to the control electrode of the semiconductor chip 78. The switching device can be controlled by an external control circuit via the control terminal.

As shown in FIG. 3 and FIG. 4, the circuit board 76 is a laminated substrate which sequentially includes an insulating plate 81 with an upper surface and a lower surface, a circuit layer 83 provided on the upper surface of the insulating plate 81, and a metal layer 85 provided on the lower surface of the insulating plate 81.

The circuit board 76 has upper and lower surfaces, and the lower surface is arranged on the upper surface of the cooling apparatus 10. The circuit board 76 of this embodiment is fixed on the upper surface of the cooling apparatus 10, via the metal layers 85 by the solder 79. Also, the upper surface of the circuit board 76 of this embodiment has, as one example, two semiconductor chips 78 fixed thereon.

The circuit board 76 may be, for example, a DCB (Direct Copper Bonding) substrate or an AMB (Active Metal Brazing) substrate. The insulating plate 81 of this embodiment includes ceramics. The insulating plate 81 may be formed using ceramic materials such as alumina ($Al_2O_3$), aluminum nitride (AlN) and silicon nitride ($Si_3N_4$). The insulating plate 81 of this embodiment is rectangular in planar view.

In this specification, a rectangle may mean a quadrangle or a rectangle, or may be a shape with at least one corner chamfered or in a smooth shape. For example, a rectangle may also include an octagonal, a dodecagon, and a hexadecagon and so on in which the four corners are chamfered respectively. Also, in this specification, a corner may not only indicate a point at which two sides are orthogonal to each other, but also a constant region including the point, and in the case where a corner is C-chamfered, it may also be any point on a side from one corner to another on the C-chamfer, or a constant region including the side, and in the case where a corner is R-chamfered, it may also be any point on the R-chamfer or a constant region including the point.

The circuit layer 83 and the metal layers 85 may be boards including conductive materials such as copper or copper alloy. The circuit layer 83 and the metal layers 85 in this embodiment are rectangular in planar view, the same as the insulating plate 81.

The circuit layer 83 is fixed on the upper surface side of the insulating plate 81 by solder, brazing or the like. On the upper surface of the circuit layer 83, the semiconductor chip 78 is connected electrically and mechanically by solder and the like, that is, connected directly in an electrical circuit manner. In addition, the circuit layer 83 may also be connected electrically with the other conductive members by wires and the like. Also, the circuit layer 83 may also be directly bonded (DCB: Direct Copper Bonding) onto the upper surface of the insulating plate 81.

As shown in FIG. 3 and FIG. 4, the resin structure 71 of this embodiment includes a sealing portion 74 for sealing the semiconductor chips 78, and an accommodating portion 72 for enclosing the sealing portion 74. The sealing portion 74 is an insulating member including resins such as, for example, silicone gel or epoxy resin. The sealing portion 74 of this embodiment also seals the circuit board 76 and the other circuit elements, in addition to the semiconductor chips 78.

The accommodating portion 72 is a frame body formed by insulating materials such as, for example, thermosetting resin, or ultraviolet curing resin. The accommodating portion 72 of this embodiment is provided enclosing the region on the upper surface 22 of the top plate 20, in which the circuit board 76 and so on is arranged. In other words, the accommodating portion 72 of this embodiment has an internal space that can accommodate the semiconductor chip 78, the circuit board 76 and the other circuit elements. The accommodating portion 72 may also be bonded to the upper surface 22 of the top plate 20. The above-mentioned sealing portion 74 is formed by, as one example, filling and curing the resin mentioned above within the internal space of the accommodating portion 72. In addition, the resin structure 71 may only include the sealing portion 74, without including the accommodating portion 72.

The cooling apparatus 10 has a top plate 20, a side wall 36, a bottom plate 64, a coolant flow portion 92, an inlet 41, an outlet 42, a plurality of fins 94 and reinforcement pins 97. In this embodiment, there is a case where the top plate 20, the side wall 36, the plurality of fins 94 and reinforcement pins 97 may be collectively referred to as the base plate 40.

The top plate 20 is a board-shaped member with a principal surface that extends in the xy plane. The top plate 20 has the circuit board 76 and the resin structure 71 of the semiconductor device 70 fixed on the principal surface. The top plate 20 of this embodiment is a substantially rectangle with longer sides and shorter sides in planar view. In addition, in this specification, when referred to as a rectangle, a square, a quadrangle, a rhomboidal or a polygon or the like, these shapes may also have at least one corner to be chamfered or in a smooth shape.

Also, in the top plate 20 of this embodiment, the shorter sides are parallel to the x axis, and the longer sides are parallel to the y axis. The top plate 20 of this embodiment includes a fastening portion 21 for fastening itself to an external device which the semiconductor module 100 is to be implemented. The fastening portion 21 is positioned in the four corners of the rectangular top plate 20 in planar view. The fastening portion 21 has penetration holes 80 through which external device bosses or the like are inserted. The fastening portion 21 of this embodiment has a total of four penetration holes 80, one by one at each of the four corners of the rectangular top plate 20.

As shown in FIG. 3, the top plate 20 has an upper surface (front surface) 22 and a lower surface (back surface) 24 which are parallel to the xy plane. The top plate 20 is formed by, as one example, metals, as one more specific example, metals including aluminum. The top plate 20 may also have a plated layer of nickel or the like formed on the surface.

In this embodiment, on the upper surface 22 of the top plate 20, the circuit board 76 of the semiconductor device 70 is directly fixed by the solder 79. More specifically, on the principal surface of the top plate 20, the metal layers 85 of the circuit board 76 are firmly fixed by the solder 79. The heat generated in each semiconductor chip 78 is transferred to the top plate 20. The top plate 20, the circuit board 76 and the semiconductor chip 78 are arranged toward the positive direction of the z axis direction in this order. The top plate 20 and the circuit board 76, and the circuit board 76 and the semiconductor chip 78, may have a thermal connection therebetween. In this embodiment, the solder 79 fixes between each member and all the members are thermally connected via the solder 79. Also, the top plate 20 of this embodiment has the above-mentioned accommodating portion 72 firmly fixed on the principal surface by the fixing agent.

The side wall 36 is connected to the top plate 20. The side wall 36 of this embodiment is integrally configured with the top plate 20. The side wall 36 is formed by, as one example, metals, and as one more specific example, formed by metals including aluminum, the same as the top plate 20. The side wall 36 has an approximately constant thickness, and configures the side surface of the cooling apparatus 10. The thickness of the side wall 36 may also be, for example, from 1 mm to 3 mm.

The side wall 36 of this embodiment has a substantially rectangle contour with longer sides and shorter sides in the xy plane. More specifically, the side wall 36 of this embodiment includes a pair of side wall elements 36L facing each other, each of which extends along the y axis direction, and a pair of side wall elements 36S facing each other, each of which extends along the x axis direction. The pair of the side wall elements 36L form the longer sides of a rectangle, and the pair of the side wall elements 36S form the shorter sides of a rectangle.

The extending direction of the side wall element 36L and the extending direction of the side wall element 36S are approximately orthogonal to each other in planar view in a range of 85 to 95 degrees, preferably intersect at 90 degrees. The length of the side wall element 36S may be shorter than the length of the side wall element 36L. The side wall element 36L may be straight, or may include a curve in planar view.

Also, the side wall 36 of this embodiment is positioned in an inner side than the fastening portion 21 of the top plate 20, extending in the negative z axis direction from the top plate 20 in planar view. In addition, the contour may also refer to the lines that form the outline of an object.

And, the side wall 36 of this embodiment includes an inclined portion 37 for connecting between one end of the side wall element 36S and one end of the side wall element 36L. In addition, FIG. 5 illustrates the inclined portion 37 as a crosshatched region, and the following figures are also the same. The side wall 36 may not include the inclined portion 37.

The inclined portion 37 inclines inwardly toward the annular side wall 36 so that it is angled with respect to the y axis direction and the x axis direction in planar view, respectively. The inner side of the annular side wall 36 may refer to the side of the region enclosed by the side wall 36 with a rectangular contour. The side wall 36 including the inclined portion 37 may have a contour of a polygon, for example, an n-polygonal (n is an integral number greater than or equal to 5), preferably a hexagon or an octagonal in planar view.

The bottom plate 64 is connected to the side wall 36 and faces the top plate 20. The bottom plate 64 of this embodiment is a board-shaped member. The bottom plate 64 of this embodiment is a rectangle with longer sides and shorter sides in planar view. Also, the bottom plate 64 of this embodiment has shorter sides parallel to the x axis and longer sides parallel to the y axis direction.

The bottom plate 64 may also be arranged directly or indirectly in close contact with the lower end of the negative z axis direction of the side wall 36. The indirect close contact refers to a state in which the lower end of the side wall 36 is in close contact with the bottom plate 64, via the fixing agent 98 provided between the lower end of the side wall 36 and the bottom plate 64, such as sealants, adhesives, and brazing materials. In this embodiment, the bottom plate 64 is arranged in close contact with the lower end of the side wall 36 via the fixing agent 98. The bottom plate 64 is formed by, as one example, metals, and as one more specific example, metals including aluminum, the same as the base plate 40.

In addition, the lower end of the side wall 36 and the bottom plate 64 are preferred to be brazed to each other. In this case, the brazing material is preferably a metal with a lower melting temperature than the base plate 40 and the bottom plate 64.

The coolant flow portion 92 is a space for circulating the coolant such as, for example, LLC or water, and is defined by the top plate 20, the side wall 36 and the bottom plate 64. In other words, the side wall 36 is arranged enclosing the coolant flow portion 92 in the xy plane, and the top plate 20 and the bottom plate 64 are arranged to face each other, sandwiching the coolant flow portion 92 in the z axis direction. Thus, the contour of the coolant flow portion 92 in the xy plane is defined by the inner circumference of the side wall 36. Therefore, the coolant flow portion 92 is rectangular in planar view. More specifically, as shown in FIG. 5, the coolant flow portion 92 is a rectangle whose cross section parallel to the principal surface of the top plate 20 has longer sides 96 and shorter sides 93. In addition, in this embodiment, the direction of the longer sides 96 is the y axis direction, and the direction of the shorter sides 93 is the x axis direction.

The coolant flow portion 92 may be sealed by the top plate 20, the side wall 36 and the bottom plate 64, and in this case, the lower end of the side wall 36 may be in close contact with the bottom plate 64. In addition, the close contact refers to a state that the coolant inside the coolant flow portion 92 does not leak out from the portion in close contact.

The inlet 41 is a penetration hole for introducing coolant to the coolant flow portion 92, and the outlet 42 is a penetration hole for deriving the coolant from the coolant flow portion 92. In this embodiment, the inlet 41 and the outlet 42 are formed on the bottom plate 64.

The inlet 41 and the outlet 42 are respectively positioned on one side of the cooling apparatus 10 and on another side opposite to the one side in the x axis direction, and, respectively positioned on one side of the cooling apparatus 10 and on another side opposite to the one side in the y axis direction. That is, the inlet 41 and the outlet 42 are positioned in both facing ends of the coolant flow portion 92 in the diagonal line direction of the coolant flow portion 92 in a rectangular shape in the xy plane.

The inlet 41 and the outlet 42 may communicate with the external coolant supply source. The coolant supply source may also have the coolant flowed into and out from the coolant flow portion 92 via the inlet 41 and the outlet 42. The coolant supply source, as one example, has a flange with a aperture formed for coolant to flow in and out, and may also have the cooling apparatus 10 fixed in the flange, so that the inlet 41 and the outlet 42 of the cooling apparatus 10 communicate to the aperture via, for example, a rubber O ring. Accordingly, the cooling apparatus 10 can import the coolant from the external coolant supply source via the inlet 41, and can export the coolant after circulating the inside of the coolant flow portion 92 to the coolant supply source via the outlet 42. In addition, instead of this, the inlet 41 and the outlet 42 can respectively be connected with the pipes communicating with the external coolant supply source, and in other words, the cooling apparatus 10 can be connected with the external coolant supply source by two pipes.

A plurality of fins 94 are arranged in the coolant flow portion 92, and extend to connect the top plate 20 and the bottom plate 64 in between. The above-mentioned coolant flow portion 92 includes a cooling region 95 with the plurality of fins 94 arranged thereto. FIG. 2 illustrates the cooling region 95 by dot lines instead of illustrating the fins 94. In addition, in the below descriptions, one or more fins 94 may be referred to as fins 94 simply.

The cooling region 95 may be rectangular in planar view. As shown in FIG. 5, the cooling region 95 of this embodiment is a rectangle in planar view, and the shorter sides are parallel to the x axis, and the longer sides are parallel to the y axis.

In the cooling region 95 of this embodiment, the number of the fins 94 aligned in the direction of the longer side 96 of the coolant flow portion 92 is greater than the number of the fins 94 aligned in the direction of the shorter side 93 of the coolant flow portion 92. The region where the fins 94 are provided and the flow channels between the fins 94 are included in the cooling region 95. In addition, the interval between adjacent fins 94 may be narrower than the width of the fins 94 themselves.

The coolant flow portion 92 further includes a first coolant flow channel 30-1 adjacent to one side of the cooling region 95, and a second coolant flow channel 30-2 adjacent to the other side which is the opposite side of the one side of the cooling region 95. In other words, the coolant flow portion 92 includes a first coolant flow channel 30-1 and a second coolant flow channel 30-2 arranged sandwiching the cooling region 95 in planar view. In this embodiment, the first coolant flow channel 30-1 is adjacent to the negative side of the x axis direction of the cooling region 95, and the second coolant flow channel 30-2 is adjacent to the positive side of the x axis direction of the cooling region 95. These coolant flow channels 30 refer to the spaces with a height higher than the predetermined height (length in the z axis direction) in the coolant flow portion 92. The height higher than the predetermined height may be the distance between the top plate 20 and the bottom plate 64.

The first coolant flow channel 30-1 communicates with the inlet 41 mentioned above, without a plurality of fins 94 arranged thereto. Similarly, the second coolant flow channel 30-2 communicates with the outlet 42 mentioned above, without a plurality of fins 94 arranged thereto. Also, in this embodiment, each of the first coolant flow channel 30-1 and the second coolant flow channel 30-2 extends in the y axis direction with a longer length in the y axis direction than the length in the x axis direction in planar view. In addition, the first coolant flow channel 30-1 is one example of the first communication region, and the second coolant flow channel 30-2 is one example of the second communication region.

The fins 94 are formed by, as one example, metals, and as one more specific example, formed by metals including aluminum, the same as the top plate 20.

The fins 94 have upper ends and lower ends facing each other in the z axis direction. The upper ends of the fins 94 of this embodiment are thermally and mechanically connected with the lower surface 24 of the top plate 20. In this embodiment, the fins 94 are configured integrally with the top plate 20, in other words, the fins 94 protrude integrally from the lower surface 24 of the top plate 20. The fins 94 of this embodiment are extending in the negative z axis direction from the lower surface 24 of the top plate 20 toward the coolant flow portion 92. The lower ends of the fins 94 of this embodiment are firmly fixed on the bottom plate 64 by the fixing agent 98. And, the extending direction of the fins 94 of this embodiment is approximately orthogonal to each principal surface of the top plate 20 and the bottom plate 64.

In this embodiment, each of the plurality of fins 94 is a pin fin. Also, the cross section parallel to the principal surface of the top plate 20 of each of the plurality of fins 94 in this embodiment is a rectangle in shape. Thereby, compared to the case where the cross section of the fin is a circle in shape, the surface area of fin 94 in contact with the coolant can be enlarged, and the heat dissipation efficiency can be improved.

Also, the plurality of fins 94 may also be arranged in the coolant flow portion 92 so that the main flow direction of the coolant in the cooling region 95 is not orthogonal to any side of the rectangle when the coolant is flowing through the coolant flow portion 92. In this embodiment, the main flow direction of the coolant in the cooling region 95 is the x axis direction. In this embodiment, the plurality of fins 94 may be arranged in the coolant flow portion 92 so that any side of the rectangle is not orthogonal to the x axis direction. More specifically, the plurality of fins 94 of this embodiment are arranged in the coolant flow portion 92 so that any side of the rectangle is not orthogonal to the x axis direction, and, one diagonal line is parallel to the y axis direction, and the other one diagonal line is parallel to the x axis direction. Instead of this, the plurality of fins 94 may also be arranged in the coolant flow portion 92 so that any side of the rectangle is not orthogonal to the x axis direction, and, one diagonal line is inclined with respect to the y axis direction, and the other one diagonal line is inclined with respect to the x axis direction. Compared with the case where the plurality of fins are arranged in the coolant flow portion 92 so that any side of the above-mentioned rectangle is orthogonal to the above-mentioned main flow direction, the flow velocity loss of the flowing coolant inside the coolant flow portion 92 can be reduced, and the heat dissipation efficiency can be improved by any of the above-mentioned configurations.

Also, the fins 94 of this embodiment have rhomboidal shapes that are longer in the direction of the shorter side 93 than in the direction of the longer side 96 of the coolant flow portion 92 in the cross section of the xy plane. Also, of one pair of diagonal lines of the rhomboidal shape, the diagonal line parallel to the longer side 96 is shorter than the diagonal line parallel to the shorter side 93. The fins 94 may have each side of the rhomboidal-cross section with a length of 1.9 mm to 2.2 mm. At each corner of the rhomboidal cross section, there may also be a rounding with a radius of curvature of 0.1 mm to 0.2 mm.

In addition, the shape of the cross section of each of the plurality of fins 94 may also be a polygon, for example, may also be a square. In this case, the plurality of fins 94 may also be arranged in the coolant flow portion 92 so that one diagonal line of the square may be along the direction toward the second coolant flow channel 30-2 from the first coolant flow channel 30-1.

Also, the plurality of fins 94 may also be arrayed to form a predetermined pattern in the xy plane of the coolant flow portion 92. In this embodiment, the plurality of fins 94 are in a staggered array as shown in FIG. 5. The plurality of fins 94 may also be in a square array in the xy plane of the coolant flow portion 92.

The reinforcement pins 97 are arranged in the coolant flow portion 92, and extend to connect between the top plate 20 and the bottom plate 64. The reinforcement pins 97 are formed by, as one example, metals, and as one more specific example, formed by metals including aluminum, the same as the top plate 20. The reinforcement pins 97 may also be formed by the metals with higher rigidity than the metals forming the top plate 20 or the fins 94.

The reinforcement pins 97 have the upper ends and lower ends facing each other in the z axis direction. The upper ends of the reinforcement pins 97 are thermally and mechanically connected to the lower surface 24 of the top plate 20. In this embodiment, the reinforcement pins 97 are configured integrally with the top plate 20, and in other words, the reinforcement pins 97 protrude integrally from the lower surface 24 of the top plate 20. The reinforcement pins 97 of this embodiment extend from the lower surface 24 of the top plate 20 toward the coolant flow portion 92 in the negative z axis direction. The lower ends of the reinforcement pins 97 of this embodiment are firmly fixed on the bottom plate 64 via, for example, the fixing agent 98. And, the extending direction of the reinforcement pins 97 of this embodiment is approximately orthogonal to each of the principal surface of the top plate 20 and the bottom plate 64.

A plurality of reinforcement pins 97 may also be arranged in the coolant flow portion 92, and the density of the plurality of reinforcement pins 97 may be less when compared to the density of the plurality of fins 94 arranged in the cooling region 95. As shown in FIG. 2 and FIG. 5, six reinforcement pins 97 are arranged in the coolant flow portion 92 of this embodiment.

In a plane parallel to the principal surface of the top plate 20, the cross sectional area of the reinforcement pins 97 is smaller than the cross sectional area of at least one fin 94 among the plurality of fins 94. As one example, in the plane, the cross sectional area of the reinforcement pins 97 is lower than or equal to 50% of the cross sectional area of each of the plurality of fins 94, and as shown in FIG. 5, the shape of the cross section parallel to the principal surface of the top plate 20 of the reinforcement pins 97 of this embodiment is a circle. The circle of the cross section is preferred to have a diameter of, for example, 1 to 1.5 mm.

In addition, the shape of the cross section parallel to the principal surface of the top plate 20 of the reinforcement pins 97 may also be a non-polygon, for example, may also be an oval, or a shape with corners of a polygon R-chamfered. When the cross section is an oval, the major axis of the oval is preferably along the y axis direction, and the minor axis is along the x axis direction. In this case, the length of the major axis of the oval is preferably 1.1 mm, and the length of the minor axis is preferably 0.9 mm.

Herein, in FIG. 5, a centerline CL passing through the center of the x axis direction of the side wall 36 and extending in the y axis direction is illustrated. In this embodiment, the center in the x axis direction of the cooling region 95 extending in the y axis direction matches the centerline CL.

In this embodiment, the metal layer 85 of each circuit board 76 has a part overlapped with the cooling region 95 in planar view, and the parts other than the part overlapped with one communication region of the first coolant flow channel 30-1 and the second coolant flow channel 30-2. In other words, the metal layer 85 of each circuit board 76, that is, each circuit board 76 is arranged shifted in the x axis direction with respect to the centerline CL shown in FIG. 5 in planar view. And then, the reinforcement pins 97 are arranged in the one communication region.

As shown in FIG. 5, any metal layer 85 of U phase unit 70U, V phase unit 70V and W phase unit 70W of this embodiment has a part overlapped with the cooling region 95, and another part overlapped with the second coolant flow channel 30-2 in planar view. And then, any of the six reinforcement pins 97 of this embodiment is arranged in the second coolant flow channel 30-2.

The reinforcement pins 97 may also have at least a part overlapped with the metal layer 85 in planar view. When the metal layers 85 are rectangular in planar view, the reinforcement pins 97 may also have at least a part overlapped with the rectangular corners of the metal layers 85 in planar view.

The reinforcement pins 97 of this embodiment have a part overlapped with the rectangular corners of the metal layers 85, and a part not overlapped with the metal layers 85 in planar view. More specifically, the reinforcement pins 97 has a part overlapped with the farthest portion in the c rectangular corners of the metal layers 85 away from the cooling region 95 in planar view.

As one specific example, as shown in FIG. 5, in each rectangular metal layer 85 in planar view, two corners positioned in the positive side of the x axis direction partially overlap two reinforcement pins 97. More specifically, the metal layers 85 in this embodiment is an octagonal in which four corners of a quadrangle C-chamfered in planar view, and of the four sides of the quadrangle, two sides facing each other are parallel to the y axis, and the other two sides facing each other are parallel to the x axis. In this embodiment, in planar view, each of the two reinforcement pins 97 that partially overlaps one metal layer 85 overlaps the intersection point between the one of the two sides positioned in the second coolant flow channel 30-2 side parallel to the y axis of the metal layer 85, and the side of the C-chamfered corner. When the reinforcement pins 97 overlap the intersection point in planar view, compared with the case where the reinforcement pins 97 overlap the portions other than the intersection point on the side of the C-chamfered corner, the lifetime of the solder 79 can be improved more effectively.

And, of the two reinforcement pins 97, the reinforcement pin 97 that is closer to the corner of the rectangular coolant flow portion 92 in planar view, is positioned between the rectangular corner of coolant flow portion 92 and the metal layer 85 in planar view. More specifically, in this embodiment, the two reinforcement pins 97 that are close to each of the two inclined portions 37 positioned in the second coolant flow channel 30-2 side of the coolant flow portion 92, are positioned between the inclined portions 37 and the metal layers 85 in planar view. In addition, the position between the rectangular corner of the coolant flow portion 92 and the metal layer 85 is intended to include any position between the corner and the metal layer 85 on any straight line connecting the rectangular corner of the coolant flow portion 92 and the metal layer 85 closest to the corner. When being defined as the position between the rectangular corner of coolant flow portion 92 and the metal layer 85, the corner which is one end of the range and the metal layer 85 which is the other end of the range may also be included.

As described above, in the semiconductor module 100 of this embodiment, in the cooling apparatus 10 with the circuit board 76 of the semiconductor device 70 fixed on the principal surface of the top plate 20, the coolant flow portion 92 where the coolant is flowing includes the cooling region 95 where the plurality of fins 94 are arranged, the first coolant flow channel 30-1 and the second coolant flow channel 30-2 that are positioned to sandwich the cooling region 95 with each other, without a plurality of fins 94 arranged in these coolant flow channel. Also, the first coolant flow channel 30-1 communicates with the inlet 41 for introducing the coolant to the coolant flow portion 92, and the second coolant flow channel 30-2 communicates with the outlet 42 for deriving the coolant from the coolant flow portion 92.

When a plurality of heat sources such as semiconductor chips 78 on the top plate 20 of the cooling apparatus 10 exist in the y axis direction, if the main flow direction of the coolant flowing to the cooling apparatus 10 is parallel to the arrangement direction of the heat sources (the y axis direction), all the heat sources can not be cooled down uniformly. In the semiconductor module 100 of this embodiment, a configuration is included where the main flow direction of the coolant flowing to the cooling apparatus 10 (positive direction of the x axis) is arranged to be orthogonal to the arrangement direction of the plurality of the heat sources (y axis direction).

More specifically, in the semiconductor module 100 of this embodiment, in the coolant flow portion 92, the cross section parallel to the principal surface of the top plate 20 (in the xy plane) is a rectangle with the longer sides 96 and the shorter sides 93, and the coolant is introduced into the coolant flow portion 92 from the inlet 41 communicating with one side of the shorter side 93 direction (the x axis direction), and then diffused throughout the coolant flow portion 92, and then derived from the outlet 42 communicating the other side of the shorter side 93 direction (the x axis direction). The coolant contacts the lower surface 24 and the fins 94 of the top plate 20 on which the circuit board 76 is placed, and cools down each semiconductor chip 78 of the semiconductor device 70. In other words, the heat generated by each semiconductor chip 78 is transferred to the coolant passing through the vicinity of the top plate 20 and the fins 94.

Thus, with the semiconductor module 100 of this embodiment, the cooling apparatus 10 can efficiently cool the heat generated from each semiconductor chip 78 arranged in the y axis direction on the upper surface of the cooling apparatus 10 by the coolant.

By the inventors and so on of the present application, experiments for repeatedly changing the external environment and the temperature due to self-heating is conducted, on a semiconductor module where the cooler including a fin area with cooling fins arranged therein and two guide areas sandwiching the fin area are implemented in a semiconductor device. However, in the two guide areas, there is no structure like a cooling fin, and the circuit board of the semiconductor device protrudes partially from the fin area to the guide area in planar view.

As a result of experiments, it has been found that the solder interposed between the metal layer provided on the lower surface of the insulating plate and the top plate of the cooling apparatus on the circuit board was subjected to the occurrence of large stresses and plastic strains at the partially protruding parts. It has been found that the greatest stresses and plastic strains occur in the solder, especially the parts close to the inside of the corner of the side wall of the cooler in planar view. It can be considered to be affected by a fact that the top plate of the cooling apparatus can be easily deformed in the guide area, especially in the above-mentioned area. In addition, it has also been found that the deformation of the top plate of the cooling apparatus is locally prevented at the parts of structures such as the side walls of the cooling apparatus, which are connected to the lower surface and have relatively high rigidity.

The semiconductor module 100 of this embodiment further has a part of the metal layer 85 of the circuit board 76 overlapped with the cooling region 95, and has a part of the metal layers 85 overlapped with the second coolant flow channel 30-2 in planar view. The above-mentioned coolant flow portion 92 further has the reinforcement pins 97 extending to connect between the top plate 20 and the bottom plate 64 in the second coolant flow channel 30-2.

In the semiconductor module 100, the semiconductor device 70 generates heat up to about 170° C. during use, while the coolant flowing through the coolant flow portion 92 of the cooling apparatus 10 maintains room temperature up to about 70° C., which may thereby cause a temperature difference of 100° C. or more between the semiconductor device 70 and the cooling apparatus 10. Also, the temperature difference may change largely depending on the temperature of the environment in which the semiconductor module 100 is placed.

With the semiconductor module 100 of this embodiment including the above-mentioned configuration, even if the difference between the linear expansion coefficient of the insulating plate 81 including, for example, ceramic and the linear expansion coefficient of the cooling apparatus 10 including, for example, aluminum is large, under conditions of repeatedly varying temperatures due to the external environment and self-heating, the occurrence of large stresses and plastic strains in the solder 79 interposed between the metal layer 85 provided on the lower surface of the insulating plate 81 and the top plate 20 of the cooling apparatus 10 can be prevented by the reinforcement pins 97 extending to connect between the top plate 20 and the bottom plate 64 of the cooling system 10. This enables the semiconductor module 100 to improve the heat cycle reliability and increase the lifetime of the solder 79.

The semiconductor module 100 of this embodiment further has a cross sectional area of the above-mentioned reinforcement pin 97 in a plane parallel to the principal surface of the top plate 20 of the cooling apparatus 10 smaller than the cross sectional area of at least one of the plurality of fins 94. If the cross sectional area of the reinforcement pin 97 is increased compared to the cross sectional area of the fin 94, the coolant introduced from the inlet 41 into the coolant flow portion 92 of the cooling apparatus 10 will cause a flow velocity loss when the coolant diffuses in the first coolant flow channel 30-1 where the fin 94 is not arranged, but this can be prevented according to the above configuration. As a result, a decrease in the cooling efficiency of the semiconductor device 70 by the cooling apparatus 10 can be prevented.

In the above embodiments, the top plate 20, the side wall 36 and the fins 94, which constitute the base plate 40, may be configured integrally. In this embodiment, the top plate 20, the side wall 36 and the fins 94 may also be formed integrally. For example, the top plate 20, the side wall 36 and the fins 94 may also be formed integrally from one piece of continuous plate member.

For example, the top plate 20, side wall 36 and fins 94 may be formed integrally by conducting, on the one piece of continuous plate member, a punching processing using the molds corresponding to the shapes of the top plate 20, side walls 36 and fins 94. As another example, the top plate 20, side wall 36 and fins 94 may also be formed integrally by conducting molding using any forging method such as cold forging at room temperature using an impact press and so on, or warm forging, hot forging or molten metal forging in high temperature environment, or by conducting molding by casting. The semiconductor module 100 of this embodiment can reduce the number of the members compared with the form of firmly fixing separately formed ones to each other, by integrally forming the top plate 20, the side wall 36 and the fins 94.

Herein, as shown in FIG. 4, the cross section thickness of the top plate 20 in the orthogonal planes (xz plane and yz plane) in the planar view direction may also be thicker on the outer side than on the inner side of the side wall 36. In the cooling apparatus 10 of this embodiment, the thickness T1 of the fastening portion 21 may also be thicker than the thickness T2 of the cooling region 95 in the top plate 20.

By thinning the thickness of the cooling region 95 in the top plate 20, the heat from the semiconductor devices 70 arranged on the upper surface 22 of the top plate 20 can be transferred efficiently to the coolant flowing inside the coolant flow portion 92. On the other hand, by improving the intensity of the fastening portion 21, the strong fastening force that can be applied when the semiconductor module 100 is tightly fastened to an external device with a bolt or the like, can prevent damage to the fastening portion 21.

Also, the thickness T3 of the side wall 36 may also be thicker than the thickness T2 of the cooling region 95 in the top plate 20. By thinning the thickness of the cooling region 95 in the top plate 20, the cooling efficiency can be improved, the same as mentioned above. On the other hand, by improving the intensity of the side wall 36 connected to the top plate 20, the cooling region 95 in the top plate 20 can be prevented from being deformed such as twisted due to mechanical or thermal effects. Thereby, the semiconductor module 100 can prevent the occurrence of large stresses and plastic strains in the solder 79 for fixing the semiconductor device 70 on the top plate 20.

Also, the thickness T4 of the bottom plate 64 may be thicker than at least any of the thickness T2 of the cooling region 95 and the thickness T3 of the side wall 36 of the top plate 20, may also thicker than the thickness T1 of the fastening portion 21 of the top plate 20. As mentioned above, the inlet 41 and the outlet 42 are respectively formed on the bottom plate 64. By forming the inlet 41 and the outlet 42 which are penetration holes on the bottom plate 64 having the largest thickness, the intensity of the cooling apparatus 10 can be improved, and the processing of the cooling apparatus 10 can be simplified. The fastening portion 21 may be integrally molded with the top plate 20 and the side wall 36 by forging processing, or may be formed by firmly fixing the flange portion of the side wall 36 and the top plate 20 which are molded by press processing.

FIG. 6 to FIG. 10 respectively illustrate a modification example of the arrangement relationship of the metal layers 85 of the semiconductor device 70, the cooling region 95 of the cooling apparatus 10, and the reinforcement pins 97 in the semiconductor module 100 according to one embodiment of the present invention.

In FIG. 6 to FIG. 10, the side wall 36, the bottom plate 64, the inlet 41 and the outlet 42 of the cooling apparatus 10, each metal layer 85 of the U phase unit 70U, the V phase unit 70V and the W phase unit 70W, the plurality of fins 94 and the cooling region 95, and the reinforcement pins 97 in the semiconductor module 100 are illustrated, and simply to clarify the description, the other configurations in the semiconductor module 100 are omitted to be illustrated.

Also, in the modification example shown in FIG. 6 to FIG. 10, compared with the configuration of the semiconductor module 100 in the embodiment described using FIG. 1 to FIG. 5, only the specific configuration arrangement, number and dimensions are different, functions and applications are the same. Thus, each configuration of the modification example shown in FIG. 6 to FIG. 10 uses the same reference number as each configuration in the embodiment described in FIG. 1 to FIG. 5, and omits the repeated descriptions.

Figure 6:
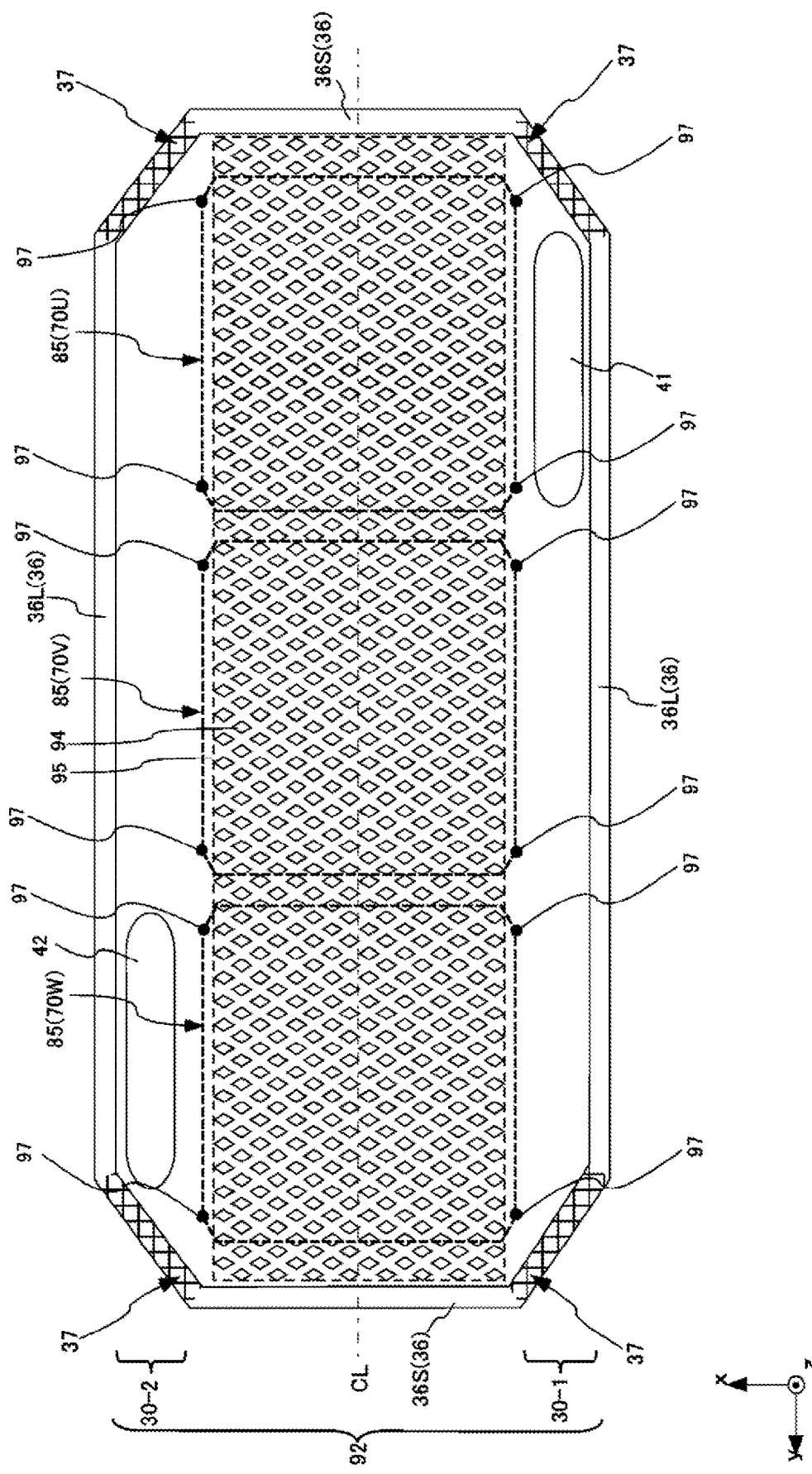
FIG. 6 illustrates a modification example of the arrangement relationship between the metal layers 85 of the semiconductor devices 70, the cooling region 95 of the cooling apparatus 10, and the reinforcement pins 97 in the semiconductor module 100 according to one embodiment of the present invention.
Figure 8:
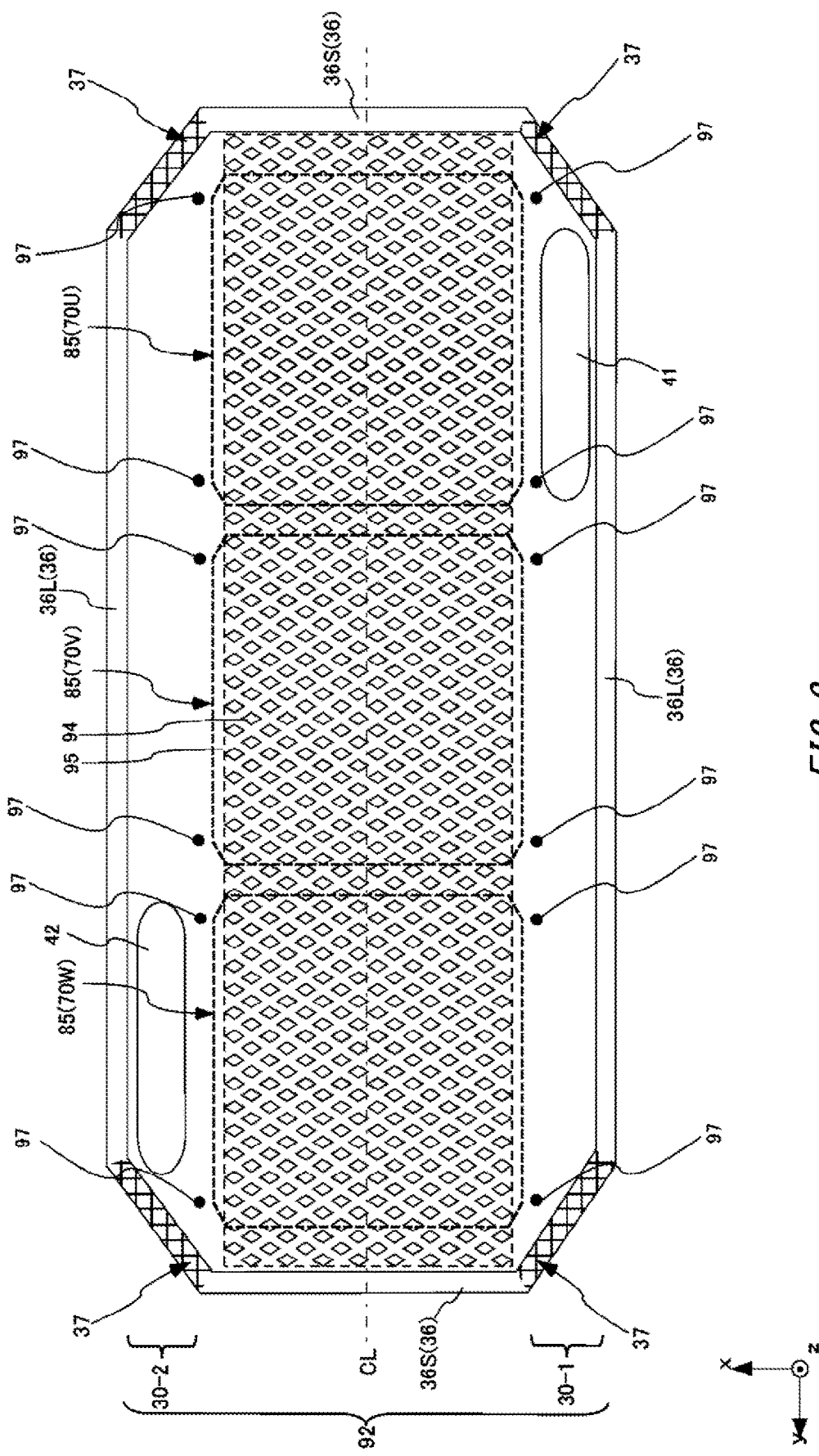
FIG. 8 illustrates a modification example of the arrangement relationship between the metal layers 85 of the semiconductor devices 70, the cooling region 95 of the cooling apparatus 10 and the reinforcement pins 97 in the semiconductor module 100 according to one embodiment of the present invention.
Figure 9:
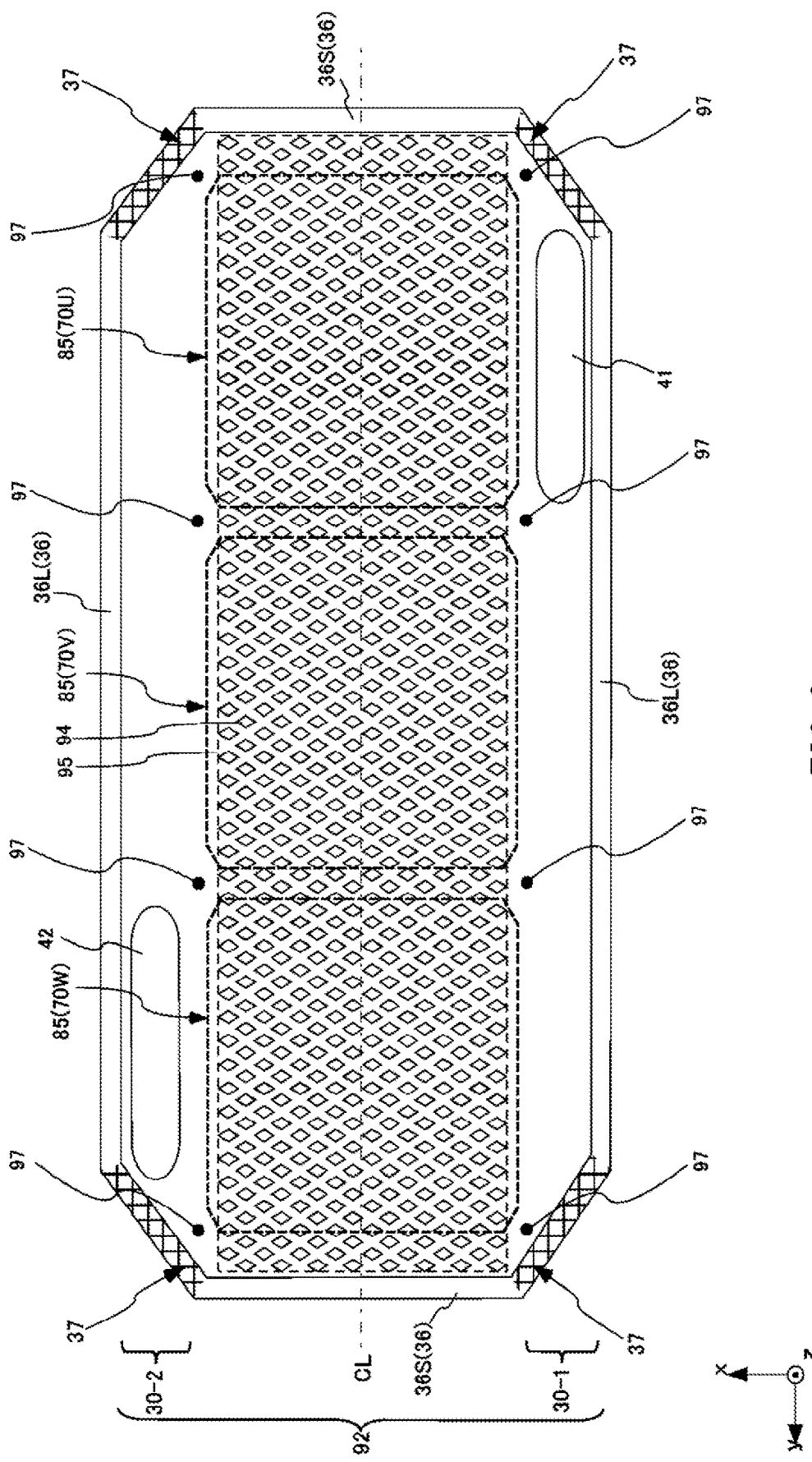
FIG. 9 illustrates a modification example of the arrangement relationship between the metal layers 85 of the semiconductor devices 70, the cooling region 95 of the cooling apparatus 10 and the reinforcement pins 97 in the semiconductor module 100 according to one embodiment of the present invention.

In the modification example shown in FIG. 6, FIG. 8 and FIG. 9, different from the embodiment described using FIG. 1 to FIG. 5, the center of the x axis direction of each circuit board 76 is arranged to be positioned on the centerline CL. And, the metal layer 85 of each circuit board 76 has a part overlapped with the cooling region 95, and a part overlapped with both of the first coolant flow channel 30-1 and the second coolant flow channel 30-2 in planar view.

In the modification example shown in FIG. 6, twelve reinforcement pins 97 are arranged in the coolant flow portion 92, and any of the reinforcement pins 97 has a part overlapped with the rectangular corners of the metal layers 85, and a part not overlapped with the metal layers 85 in planar view. In other words, in each of the three metal layers 85 included in the semiconductor device 70 of the semiconductor module 100, one reinforcement pin 97 is partially overlapped with each of the four corners of the rectangular metal layers 85 in planar view. More specifically, in this embodiment, each of the four reinforcement pins 97 that partially overlap one metal layer 85 respectively overlap the intersection points of the two sides parallel to the y axis of the metal layer 85 and the side of the C-chamfered corner in planar view. Also, in this embodiment, the four reinforcement pins 97 that are close to each of the four inclined portions 37 are respectively positioned between the inclined portion 37 and the metal layer 85 in planar view. The semiconductor module 100 according to this modification has the same effect as mentioned above.

Figure 7:
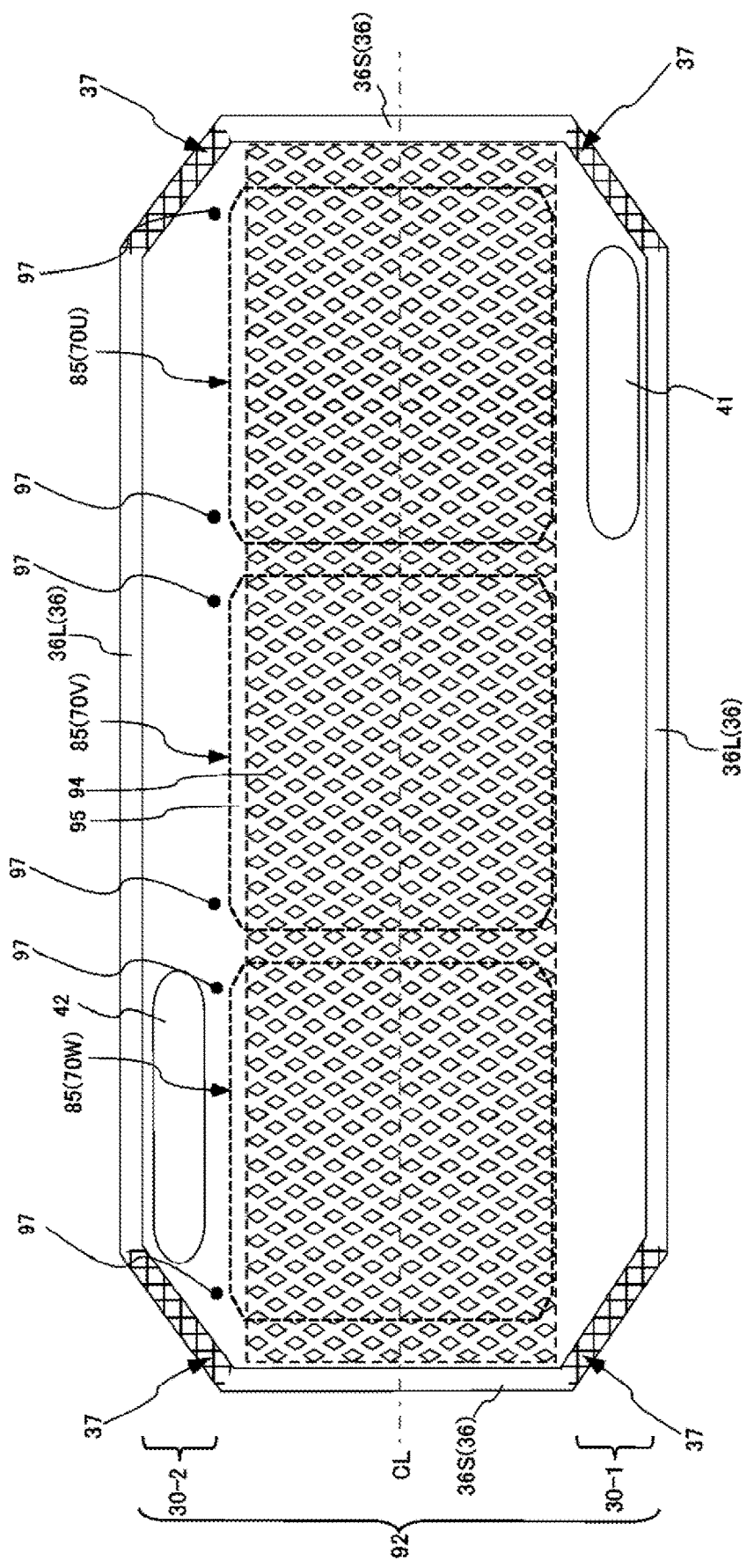
FIG. 7 illustrates a modification example of the arrangement relationship between the metal layers 85 of the semiconductor devices 70, the cooling region 95 of the cooling apparatus 10, and the reinforcement pins 97 in the semiconductor module 100 according to one embodiment of the present invention.

In the modification example shown in FIG. 7, the same as the embodiment shown in FIG. 1 to FIG. 5, six reinforcement pins 97 are arranged in the coolant flow portion 92. Also, in this modification, the same as the embodiment shown in FIG. 1 to FIG. 5, the metal layer 85 of each circuit board 76 has a part overlapped with the cooling region 95, and the parts other than the part overlapped with one communication region of the first coolant flow channel 30-1 and the second coolant flow channel 30-2 in planar view. In other words, the metal layer 85 of each circuit board 76, that is, each circuit board 76 is arranged shifted in the x axis direction with respect to the centerline CL indicated in the FIG. 7 in planar view. Then, the reinforcement pins 97 are arranged in the one communication region.

As a different point from the embodiment shown in FIG. 1 to FIG. 5, in this modification, any reinforcement pin 97 does not overlap the metal layer 85 and is positioned in the vicinity of a rectangular corner of the metal layers 85 in planar view. In other words, in each of the three metal layers 85 included in the semiconductor device 70 of the semiconductor module 100, in planar view, one reinforcement pin 97 is positioned slightly outside each of the four rectangular corners of the metal layer 85. In addition, the vicinity of the corners may also include any position of the circle range with the corner as the center, inside the region that does not overlap the metal layer 85 in planar view. Also, the vicinity of the corner may also include the position away from the corner in the x axis direction, the position away from the corner in the y axis direction, or the position away from the corner in both of the x and y axis directions inside the region that does not overlap the metal layer 85 in planar view.

Preferably, the reinforcement pin 97 may be positioned apart by a specific distance from the portion that is farthest away from the cooling region 95 at the rectangular corner of the metal layer 85 in planar view. An example of the distance may also be equal to or greater than 0 mm but equal to or less than 2 mm along the direction away from the cooling region 95. The direction away from the cooling region 95 described here is, as one example, a direction orthogonal to one side adjacent to one coolant flow channel 30 of the four sides of the cooling region 95, which is rectangular in planar view, and is a direction away from the cooling region 95. In this embodiment, it is the positive direction of the x axis. In addition, the same as the modification example shown in FIG. 8, the repeated descriptions are omitted.

Also, as shown in FIG. 7, for each of the two metal layers 85 positioned at both ends of the y axis direction, in planar view, in the rectangular metal layer 85, the two reinforcement pins 97 positioned in the vicinity of the two corners near the side wall element 36S of the side wall 36 are positioned between the rectangular corner of the coolant flow portion 92 and the metal layer 85 in planar view. More specifically, in this embodiment, the four reinforcement pins 97 close to each of the four inclined portions 37 are respectively positioned between the inclined portion 37 and the metal layer 85 in planar view. The semiconductor module 100 according to this modification has the same effect as mentioned above.

In the modification example shown in FIG. 8, the same as the modification example shown in FIG. 6, twelve reinforcement pins 97 are arranged in the coolant flow portion 92. As a different point from the modification example shown in FIG. 6, the same as the modification example shown in FIG. 7, any reinforcement pin 97 does not overlap the metal layer 85 and is positioned in the vicinity of a rectangular corner of the metal layers 85 in planar view. Also, as shown in FIG. 8, for each of the two metal layers 85 positioned at both ends of the y axis direction, in planar view, in the rectangular metal layer 85, the four reinforcement pins 97 positioned in the vicinity of the two corners near the side wall element 36S of the side wall 36 are positioned between the rectangular corner of the coolant flow portion 92 and the metal layer 85 in planar view. The semiconductor module 100 according to this modification has the same effect as mentioned above.

In the modification example shown in FIG. 9, eight reinforcement pins 97 are arranged in the coolant flow portion 92, and the same as the modification example shown in FIG. 8, any reinforcement pin 97 does not overlap the metal layer 85 and is positioned in the vicinity of a rectangular corner of the metal layers 85 in planar view. Also, as shown in FIG. 9, for each of the two metal layers 85 positioned at both ends of the y axis direction, in planar view, in the rectangular metal layer 85, the four reinforcement pins 97 positioned in the vicinity of the two corners near the side wall element 36S of the side wall 36 are positioned between the rectangular corner of the coolant flow portion 92 and the metal layer 85 in planar view.

As a different point from the modification example shown in FIG. 8, in this modification example, only one reinforcement pin 97 is arranged between the rectangular corners of the two metal layers 85 adjacent to each other in planar view. In other words, in this modification, the reinforcement pins 97 that should be positioned in the vicinity of the corners of each metal layer 85 are unified as one in, for example, the center position, between the two corners facing each other of the metal layers 85 adjacent to each other.

And, in this modification, the same as the modification example shown in FIG. 8, the reinforcement pins 97 are positioned apart by a specific distance from the farthest portion from the cooling region 95 at the rectangular corner of the metal layers 85 in planar view, and the distance is, as one example, greater than 0 mm but less than 2 mm along the direction away from the cooling region 95. As a different point from the modification example shown in FIG. 8, in this modification example, the direction away from the cooling region 95 is the direction that is oblique with respect to both of the x and y axis directions. The same as the modification example shown in FIG. 10, the repeated descriptions are omitted. The semiconductor module 100 according to this modification has the same effect as mentioned above.

Figure 10:
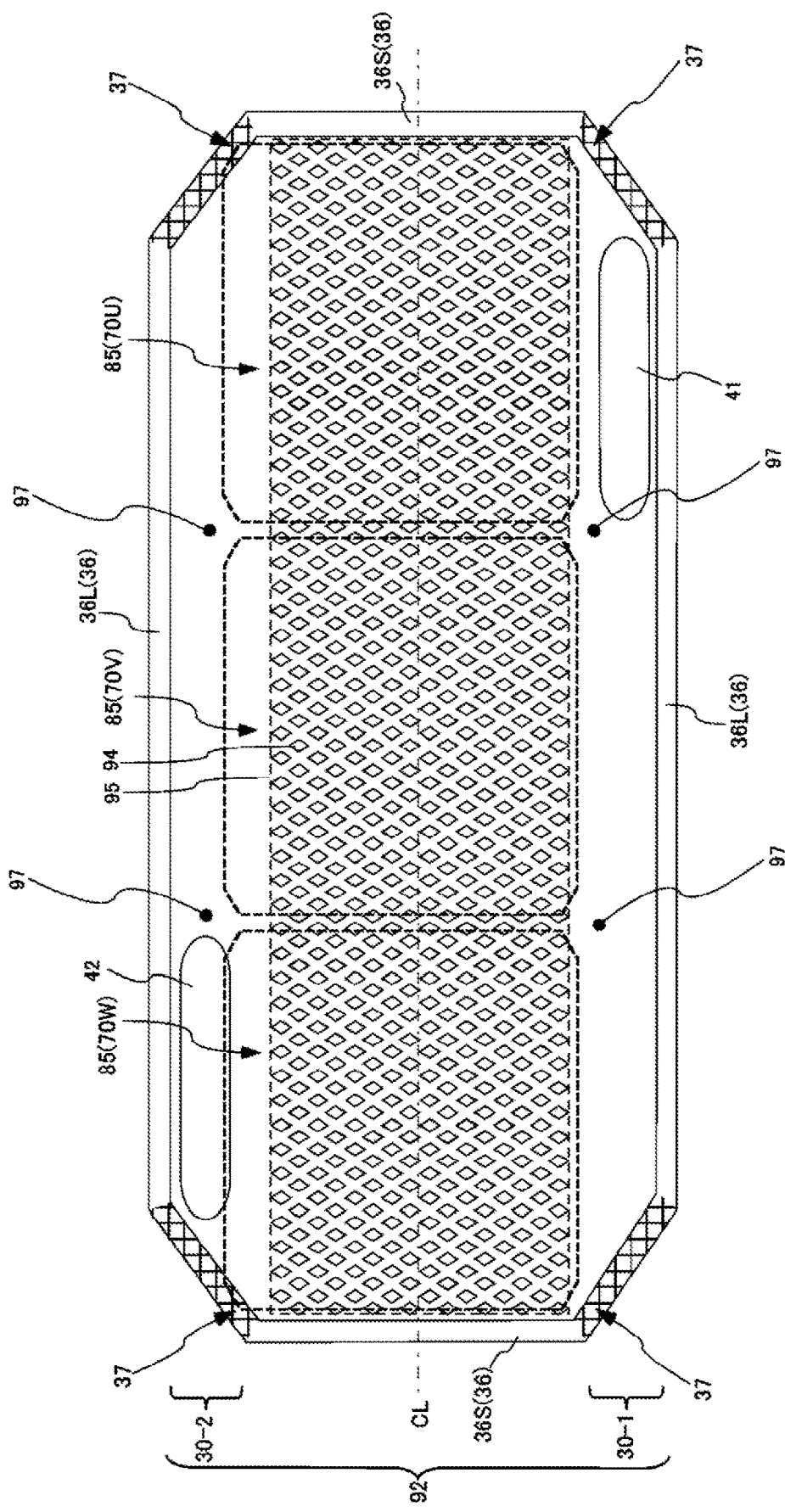
FIG. 10 illustrates a modification example of the arrangement relationship between the metal layers 85 of the semiconductor devices 70, the cooling region 95 of the cooling apparatus 10, and the reinforcement pins 97 in the semiconductor module 100 according to one embodiment of the present invention.

In the modification example shown in FIG. 10, four reinforcement pins 97 are arranged in the coolant flow portion 92, and the same as the modification example shown in FIG. 9, any reinforcement pin 97 does not overlap the metal layer 85 in planar view and is positioned in the vicinity of a rectangular corner of the metal layers 85. Also, the same as the modification example shown in FIG. 9, only one reinforcement pin 97 is arranged between the rectangular corners of the two metal layers 85 adjacent to each other in planar view. That is, in planar view, two reinforcement pins 97 are arranged one by one between the rectangular corner of the metal layer 85 positioned most negatively in the y axis direction and the rectangular corner of the metal layer 85 adjacent to the metal layer 85, and the remaining two reinforcement pins 97 are arranged one by one between the rectangular corner of the metal layer 85 positioned most positively in the y axis direction and the rectangular corner of the metal layer 85 adjacent to the metal layer 85.

As a different point form the modification example shown in FIG. 9, in this modification, the metal layer 85 of each circuit board 76, that is, each circuit board 76 is arranged shifted in the x axis direction with respect to the centerline CL indicated in the FIG. 10 in planar view. However, in this modification, the same as the modification example shown in FIG. 9, the metal layer 85 of each circuit board 76 has a part overlapped with the cooling region 95, and other than a part overlapped with both of the first coolant flow channel 30-1 and the second coolant flow channel 30-2 in planar view.

Also, in the modification example shown in FIG. 10, in planar view, one corner of the metal layer 85 of the circuit boards 76 positioned at both ends of the y axis direction partially overlaps the inclined portion 37 of the side wall 36. For example, in planar view, the metal layer 85 is a rectangle, and a corner of the metal layer 85 may also partially overlap the inclined portion 37.

More specifically, only one of the four corners of the metal layer 85 of each circuit board 76 of the U phase unit 70U and the W phase unit 70W, may also partially overlap the inclined portion 37 of the side wall 36. More specifically, one corner located on the negative direction side of the y axis and on the positive direction side of the x axis of the metal layer 85 of the U phase unit 70U located on the most negative direction side of the y axis among three units may be partially overlapped with one inclined portion 37 located on the negative direction side of the y axis and on the positive direction side of the x axis of the side wall 36. More specifically, one corner located on the positive direction side of the y axis and on the positive direction side of the x axis of the metal layer 85 of the W phase unit 70W located on the most positive direction side of the y axis among three units may be partially overlapped with one inclined portion 37 located on the positive direction side of the y axis and on the positive direction side of the x axis of the side wall 36.

Instead of this, in planar view, two corners of the metal layers 85 of the circuit board 76 may also at least partially overlap the two inclined portions 37 of the side wall 36. More specifically, each of two corners positioned in the negative direction side of the y axis of the metal layer 85 of the U phase unit 70U positioned in the most negative direction side of the y axis among the three units may partially overlap each of two inclined portions 37, which are positioned in the negative direction side of the y axis of the side wall 36. And similarly, each of two corners positioned in the positive direction side of the y axis of the metal layer 85 of the W phase unit 70W positioned in the most positive direction side of the y axis among the three units, may partially overlap each of two inclined portions 37, which are positioned in the y axis positive side of the side wall 36.

The metal layer 85 is a rectangle as mentioned above, and may have one group of sides extending in the x axis direction and one group of sides extending in the y axis direction in planar view. The metal layer 85 may also include a plurality of corners provided by a chamfer at the corners.

In planar view, the contour of at least one corner of the metal layer 85 of the circuit board 76 may also positioned between the inner side and the outer side of the inclined portion 37 of the side wall 36. As shown in FIG. 10, in this example, the corner positioned in the positive direction side of the x axis of the two corners positioned in the negative side in the y axis direction of the metal layer 85 of U phase unit 70U, may be positioned between the inner side and outer side of the inclined portion 37 positioned in the positive direction side of the x axis of the two inclined portions 37 positioned in the negative side in the y axis direction of the side wall 36 in planar view. And similarly, the corner positioned in the positive direction side of the x axis of the two corners positioned in the positive side in the y axis direction of the metal layer 85 of W phase unit 70W, may also be positioned between the inner side and outer side of the inclined portion 37 positioned in the positive direction side of the x axis of the two inclined portions 37 positioned in the positive side in the y axis direction of the side wall 36.

Also, in planar view, the portions other than the corners of the metal layer 85 of the circuit board 76 may also not overlap the side wall 36. As shown in FIG. 10, in this example, in planar view, the portions other than the corners positioned in the positive direction side of the x axis of the two corners positioned in the negative side in the y axis direction of the metal layer 85 of U phase unit 70U may also not overlap the side wall 36. And similarly, the portions other than the corners positioned in the positive direction side of the x axis of the two corners positioned in the positive direction side of the y axis direction of the metal layers 85 of W phase unit 70W may also not overlap the side wall 36. The semiconductor module 100 according to this modification example has the same effect as mentioned above.

Figure 11:
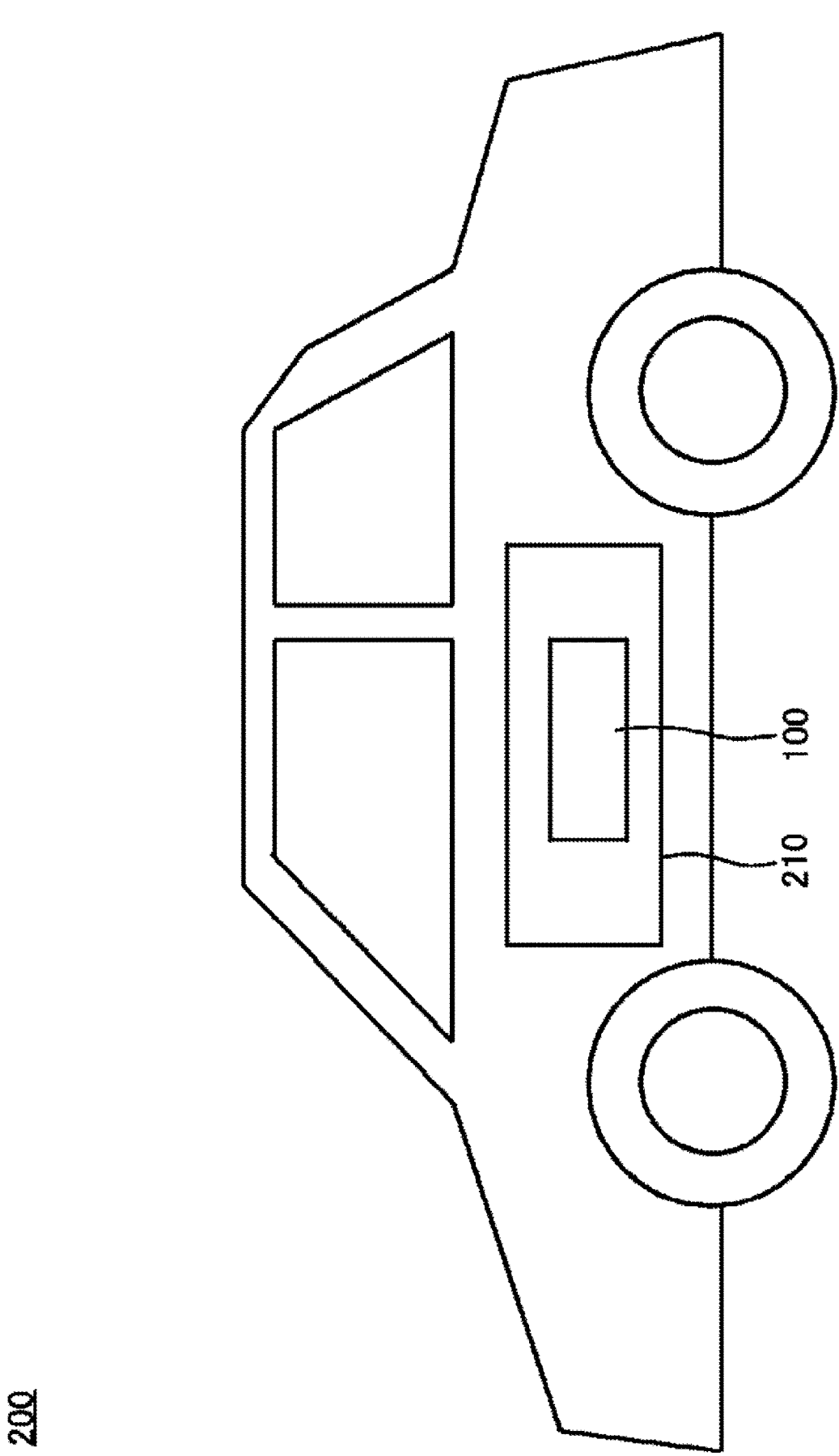
FIG. 11 illustrates a schematic view of a vehicle 200 according to one embodiment of the present invention.

FIG. 11 illustrates the schematic view of a vehicle 200 according to one embodiment of the present invention. The vehicle 200 is a vehicle with at least a part of the driving force being generated using electrical power. As one example, the vehicle 200 is an electric vehicle with all the driving force being generated by an electrically driven device such as a motor, or a hybrid vehicle jointly using an electrically driven device such as a motor and an internal combustion engine driven by fuel such as gasoline.

The vehicle 200 includes a control device 210 (external device) for controlling the electrically driven device such as a motor. A semiconductor module 100 is provided in the control device 210. The semiconductor module 100 may control the electrical power supplied to the electrically driven device.

Figure 12:
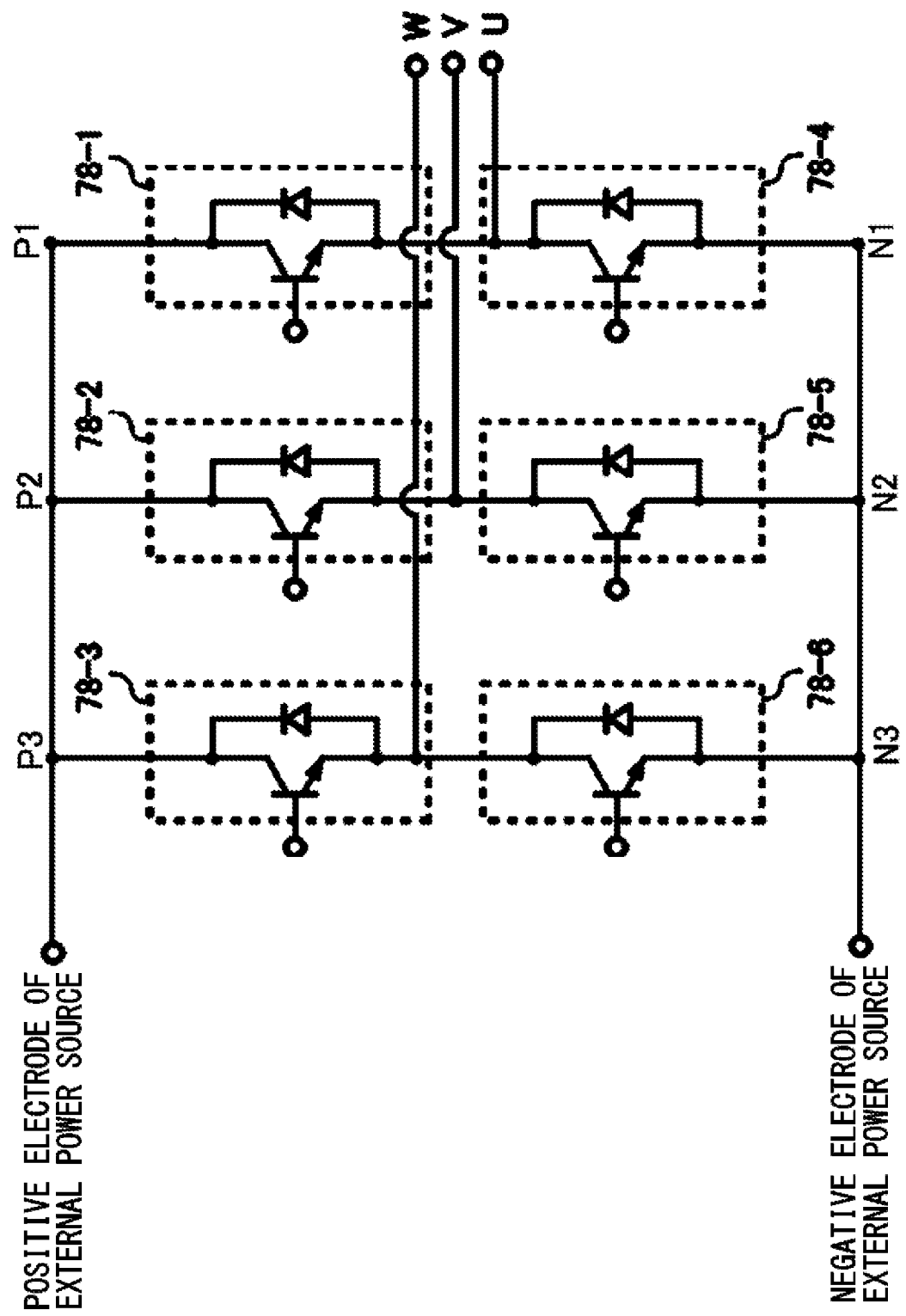
FIG. 12 illustrates a main circuit diagram of the semiconductor module 100 according to one embodiment of the present invention.

FIG. 12 illustrates the main circuit diagram of the semiconductor module 100 according to a plurality of embodiments of the present invention. The semiconductor module 100 functions as a three-phase AC inverter circuit with output terminals U, V and W, and may be a part of the on-vehicle unit for driving the motor of a vehicle.

In the semiconductor module 100, the semiconductor chips 78-1, 78-2 and 78-3 may configure an upper arm, and the semiconductor chips 78-4, 78-5 and 78-6 may configure a lower arm. A pair of semiconductor chips 78-1, 78-4 may configure a leg (U phase). A pair of semiconductor chips 78-2, 78-5, and a pair of semiconductor chips 78-3, 78-6 may also configure legs (V phase, W phase) similarly. In the semiconductor chip 78-4, the emitter electrode may be electrically connected to the input terminal N1, and the collector electrode may be electrically connected to the output terminal U, respectively. In the semiconductor chip 78-1, the emitter electrode may be electrically connected to the output terminal U, and the collector electrode may be electrically connected to the input terminal P1, respectively. Similarly, in semiconductor chips 78-5 and 78-6, the emitter electrodes may be electrically connected to the input terminals N2 and N3 respectively, and the collector electrodes may be electrically connected to the output terminals V and W respectively. Furthermore, in semiconductor chips 78-2 and 78-3, the emitter electrodes may be electrically connected to the output terminals V and W respectively, and the collector electrodes may be electrically connected to the input terminals P2 and P3, respectively.

Each of the semiconductor chips 78-1 to 78-6 may be alternately switched by the signals input to the corresponding control terminals. In this embodiment, each semiconductor chip 78 may generate heat during the switching. The input terminals P1, P2 and P3 may be connected to the positive electrode of the external power source, and the input terminals N1, N2 and N3 may be connected to the negative electrode of the external power source, and the output terminals U, V and W may be connected to the loads, respectively. The input terminals P1, P2 and P3 may be electrically connected to each other, and the other input terminals N1, N2 and N3 may also be electrically connected to each other.

In the semiconductor module 100, the plurality of the semiconductor chips 78-1 to 78-6 may be the RC-IGBT (reverse conducting IGBTs) semiconductor chips, respectively. Also, the semiconductor chips 78-1 to 78-6 may include the combinations of transistors such as MOSFETs or IGBTs and diodes, respectively.

In the above descriptions of a plurality of embodiments, for example, such as "approximately orthogonal", "approximately the same", "approximately match", "approximately constant", "approximately symmetrical", "approximately rhomboidal", and "approximately rectangular", the words together with "approximately" may be used to describe a specific state, but any of these is intended to include not only those that are strictly in the specific state, but also those that are generally in that specific state.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, in the embodiment mentioned above, the semiconductor module 100 has been described to be a configuration including three semiconductor devices 70, but instead of this, it may include one, two, or four or more semiconductor devices 70.

For example, the fins 94 may be arranged in a lattice pattern, also preferably in an oblique lattice pattern or rhomboidal grid lattice pattern. And for example, the inlet 41 and the outlet 42 are adjacent to the cooling region 95, and may also be provided on the diagonal line in the coolant flow portion 92. And for example, the apertures of the inlet 41 and the outlet 42 may also have the length in the longer side 96 direction longer than the length in the shorter side 93 direction in planar view.

For example, in the embodiment mentioned above, in the base plate 40, the top plate 20, the side wall 36 and the fins 94 have been described to be an integrally formed configuration, but instead of this, the top plate 20, the side wall 36 and the fins 94 may also be firmly fixed onto each other by fixing agent 98 and so on after they are formed respectively.

Also, the top plate 20 and the side wall 36 may also be formed integrally, and the separately formed fins 94 may be firmly fixed onto the top plate 20. Also, the top plate 20 and the fins 94 may also be integrally formed, and the separately formed side wall 36 may be firmly fixed onto the top plate 20 by the fixing agent 98 and so on. Also, the side wall 36 and the bottom plate 64 may also be integrally formed by, for example, drawing processing, and the separately formed top plate 20 may also be firmly fixed onto the side wall 36 by the fixing agent 98 and so on, for example, brazing. In this case, the side wall 36 may also extend in the xy plane to the region where the fastening portion 21 of the top plate 20 is positioned, and the extending plane of the side wall 36 may also be connected to the lower surface 24 of the top plate 20.

Also, for example, in the embodiment mentioned above, the fins 94 have been described as a configuration being integrally formed with the top plate 20 and extending toward the bottom plate 64, but instead of this, the fins 94 may also be integrally formed with the bottom plate 64, and extend toward the top plate 20 from the bottom plate 64. In addition, in this case, the edge of the fins 94 and the top plate 20 may be firmly fixed together with the fixing agent 98 and so on.

Also, for example, in the embodiment mentioned above, the fins 94 have been described as a configuration extending in the normal line direction of the principal surface of the top plate 20 between the top plate 20 and the bottom plate 64, that is, extending perpendicularly to the top plate 20 and the bottom plate 64, but instead of this, the fins 94 may also extend obliquely with an angle with respect to the normal line direction of the principal surface of the top plate 20 between the top plate 20 and the bottom plate 64. Also, the dimension of the cross section in the xy plane of the fins 94, may be constant in the z axis direction, may also change, and as one more specific example, may also extend from any one of the top plate 20 and the bottom plate 64 to the other to taper toward the edge.

Also, for example, in the embodiment mentioned above, the plurality of fins 94 have been described as pin fins respectively, but instead of this, they may also be board-shaped blade fins, for example, the cross sectional shape parallel to the principal surface of the top plate 20 may be elongated rectangle.

Also, for example, in the embodiment mentioned above, the inlet 41 for introducing the coolant to the coolant flow portion 92, and the outlet 42 for deriving the coolant from the coolant flow portion 92 have been described to be configurations formed on the bottom plate 64, but instead of this, the inlet 41 and the outlet 42 may also be formed on the side wall 36. In this case, the inlet 41 and the outlet 42 may also be formed on the two side surfaces facing each other in the x axis direction of the side wall 36.

Also, for example, in the embodiment mentioned above, in planar view, the inner side of the side wall 36 have been described as a straight line, but it may not only be limited to a straight line, but also a polygonal line or a curve. For example, in planar view, the inner side of the side wall 36 and so on may be an arched and bulged curve on the side of the coolant flow portion 92 or an arched and concave curve on the opposite side.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: cooling apparatus; 20: top plate; 21: fastening portion; 22: upper surface; 24: lower surface; 30: coolant flow channel; 31-1: the first coolant flow channel; 30-2: the second coolant flow channel; 36, 38, 39: side wall; 36S, 36L, 38S, 38L, 39S, 39L: side wall element; 37, 37S, 37L: inclined portion; 40: base plate; 41: inlet; 42: outlet; 64: bottom plate; 70: semiconductor device; 70U: U phase unit; 70V: V phase unit; 70W: W phase unit; 71: resin structure; 72: accommodating portion; 74: sealing portion; 76: circuit board; 78: semiconductor chip; 79: solder; 80: penetration hole; 81: insulating plate; 83: circuit layer; 85, 86, 87, 88, 89, 90: metal layer; 92: coolant flow portion; 93: shorter side; 96: longer side; 94: fin; 95: cooling region; 97: reinforcement pin; 98: fixing agent; 100: semiconductor module; 200: vehicle; 210: control device

What is claimed is:

1. A semiconductor module comprising a semiconductor device and a cooling apparatus, wherein
   the semiconductor device includes semiconductor chips, circuit boards where the semiconductor chips are implemented, and a resin structure for sealing the semiconductor chips;
   the cooling apparatus includes:
   a top plate in which the circuit board and the resin structure of the semiconductor device are fixed on its principal surface;
   a side wall connected to the top plate;
   a bottom plate connected to the side wall and facing the top plate;
   a coolant flow portion for distributing coolant which is defined by the top plate, the side wall and the bottom plate;
   an inlet for introducing the coolant to the coolant flow portion;
   an outlet for deriving the coolant from the coolant flow portion; and
   a plurality of fins and reinforcement pins arranged in the coolant flow portion and extending for connecting between the top plate and the bottom plate; the coolant flow portion includes:
   a coolant region where the plurality of fins are arranged;
   a first communication region adjacent to one side of the cooling region and communicated with the inlet, and not arranged with the plurality of fins; and
   a second communication region adjacent to another side of the cooling region that is an opposite side of the one side and communicated with the outlet, and not arranged with the plurality of fins; wherein
   the circuit board is a laminated substrate sequentially including an insulating plate with an upper surface and a lower surface, a circuit layer provided on the upper surface, a metal layer provided on the lower surface;
   the metal layer has a part overlapped with the cooling region, and parts other than the part overlapped with one communication region of the first communication region and the second communication region in planar view;
   the reinforcement pins are arranged in the first and second communication regions at each corner of the metal layer; and
   a cross sectional area of the reinforcement pins is smaller than a cross sectional area of at least one fin of the plurality of fins in a plane parallel to the principal surface of the top plate.

2. The semiconductor module according to claim 1, wherein
   at least a part of the reinforcement pins overlap the metal layer in planar view.

3. The semiconductor module according to claim 2, wherein
   the metal layer is rectangular in planar view; and
   at least a part of the reinforcement pins overlaps a rectangular corner of the metal layer in planar view.

4. The semiconductor module according to claim 3, wherein
   a part of the reinforcement pins overlap the rectangular corner of the metal layer, and parts other than the part do not overlap the metal layer in planar view.

5. The semiconductor module according to claim 4, wherein
   the at least a part of the reinforcement pins overlap a farthest portion from the cooling region at the rectangular corner of the metal layer in planar view.

6. The semiconductor module according to claim 5, wherein the reinforcement pins are positioned, along a direction away from the cooling region, apart by a distance between 0 mm and 2 mm, inclusive, from a farthest portion from the cooling region in the rectangular corner of the metal layer, in planar view.

7. The semiconductor module according to claim 5, wherein
   the semiconductor device include two or more of the circuit boards; and
   in planar view, only one of the reinforcement pins is arranged between the rectangular corners of each of two metal layers including the metal layer adjacent to each other.

8. The semiconductor module according to claim 3, wherein
   the at least a part of the reinforcement pins overlap a farthest portion from the cooling region at the rectangular corner of the metal layer in planar view.

9. The semiconductor module according to claim 1, wherein
   the metal layer is rectangular in planar view; and
   the reinforcement pins do not overlap the metal layer, and are positioned in a vicinity of rectangular corners of the metal layer in planar view.

10. The semiconductor module according to claim 9, wherein
    the semiconductor device include two or more of the circuit boards; and
    in planar view, only one of the reinforcement pins is arranged between the rectangular corners of each of two metal layers including the metal layer adjacent to each other.

11. The semiconductor module according to claim 10, wherein
    a cross section parallel to the principal surface of the top plate of each of the plurality of fins has a shape of rectangle; and
    the plurality of fins are arranged in the coolant flow portion so that any side of the rectangle is not orthogonal to a main flowing direction of the coolant in the cooling region, when the coolant is flowing through the coolant flow portion.

12. The semiconductor module according to claim 1, wherein
    the coolant flow portion is rectangular in planar view; and
    the reinforcement pins are positioned between rectangular corners of the coolant flow portion and the metal layer in planar view.

13. The semiconductor module according to claim 1, wherein
    a cross section parallel to the principal surface of the top plate of the reinforcement pins has a shape of circle.

14. The semiconductor module according to claim 1, wherein
    a cross section parallel to the principal surface of the top plate of the reinforcement pins has a shape of non-polygon; and
    a cross section parallel to the principal surface of the top plate of each of the plurality of fins has a shape of polygon.

15. The semiconductor module according to claim 1, wherein
    a density of the plurality of reinforcement pins arranged in at least one of the communication regions is less when compared to a density of the plurality of fins arranged in the cooling region.

16. The semiconductor module according to claim 1, wherein
    the insulating plate includes ceramic;
    the metal layers are firmly fixed by solder to the principal surface of the top plate.

17. The semiconductor module according to claim 1, wherein
    the resin structure includes a sealing portion for sealing the semiconductor chip, and an accommodating portion for enclosing the sealing portion; and
    the accommodating portion is firmly fixed by fixing agent to the principal surface of the top plate.

18. A vehicle comprising a semiconductor module according to claim 1.

* * * * *